United States Patent
Shimamune et al.

(10) Patent No.: US 8,810,285 B2
(45) Date of Patent: Aug. 19, 2014

(54) SEMICONDUCTOR INTEGRATED CIRCUIT APPARATUS AND RADIO-FREQUENCY POWER AMPLIFIER MODULE

(71) Applicant: Murata Manufacturing Co., Ltd., Nagaokakyo (JP)

(72) Inventors: Yusuke Shimamune, Nagaokakyo (JP); Yasunobu Yoshizaki, Nagaokakyo (JP); Norio Hayashi, Nagaokakyo (JP); Takayuki Tsutsui, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/026,076

(22) Filed: Sep. 13, 2013

(65) Prior Publication Data
US 2014/0015568 A1 Jan. 16, 2014

Related U.S. Application Data

(63) Continuation of application No. PCT/JP2012/068973, filed on Jul. 26, 2012.

(30) Foreign Application Priority Data

Aug. 31, 2011 (JP) ................. 2011-188269

(51) Int. Cl.
*H03F 3/45* (2006.01)
*H04B 1/04* (2006.01)
*H03F 3/16* (2006.01)
*H03G 3/30* (2006.01)
*H03F 3/195* (2006.01)
*H03F 3/68* (2006.01)
*H04W 52/52* (2009.01)
*H03F 3/24* (2006.01)
*H03F 3/72* (2006.01)
*H03F 3/21* (2006.01)

(52) U.S. Cl.
CPC ............ *H04W 52/52* (2013.01); *H03G 3/3042* (2013.01); *H03F 2203/7209* (2013.01); *H03F 3/195* (2013.01); *H03F 3/68* (2013.01); *H03F 2200/111* (2013.01); *H03F 3/245* (2013.01); *H03F 3/72* (2013.01); *H03F 3/211* (2013.01)

USPC ........ 327/103; 327/352; 327/105; 455/127.1; 330/277; 330/285; 330/295

(58) Field of Classification Search
USPC ................ 327/103, 105, 107, 72–78, 80–82, 327/50–53, 63–66, 68–70, 350–352; 455/127.1, 78; 330/277, 295, 285, 51, 330/129, 133, 134, 289
See application file for complete search history.

(56) References Cited

U.S. PATENT DOCUMENTS 6,636,114 B2 * 10/2003 Tsutsui et al. ................. 330/51
7,340,227 B2 * 3/2008 Yoshimi et al. ............ 455/127.1

(Continued)

FOREIGN PATENT DOCUMENTS

| JP | 8-084036 A | 3/1996 |
|----|------------|--------|
| JP | 2001-211125 A | 8/2001 |
| JP | 2003-298431 A | 10/2003 |
| JP | 2006-324878 A | 11/2006 |
| JP | 2007-174553 A | 7/2007 |
| JP | 2009-284034 A | 12/2009 |
| JP | 2011-055446 A | 3/2011 |
| WO | 03/073627 A1 | 9/2003 |

OTHER PUBLICATIONS

Official Communication issued in International Patent Application No. PCT/JP2012/068973, mailed on Oct. 30, 2012.

*Primary Examiner* — Lincoln Donovan
*Assistant Examiner* — Thomas Skibinski
(74) *Attorney, Agent, or Firm* — Keating & Bennett, LLP

(57) ABSTRACT

In a semiconductor integrated circuit apparatus and a radio-frequency power amplifier module, a log detection portion including multiple-stage amplifier circuits, multiple level detection circuits, adder circuits, and a linear detection portion including a level detection circuit are provided. Output current from the log detection portion and output current from the linear detection portion are multiplied by different coefficients and the results of the multiplication are added to each other to realize the multiple detection methods. For example, current resulting from multiplication of the output current from the log detection portion by ×6/5 is added to the output current from the linear detection portion to realize a log detection method and, current resulting from multiplication of the output current from the log detection portion by ×1/5 is added to current resulting from multiplication of the output current from the linear detection portion by ×3 to realize a log-linear detection method.

20 Claims, 19 Drawing Sheets

(56) References Cited

U.S. PATENT DOCUMENTS

2005/0218989 A1 10/2005 Tsutsui et al.
2006/0264182 A1 11/2006 Morioka
2007/0066250 A1* 3/2007 Takahashi et al. .......... 455/127.1
2009/0289717 A1* 11/2009 Tanaka et al. ................. 330/277
2011/0057730 A1 3/2011 Makioka et al.

* cited by examiner

SEMICONDUCTOR INTEGRATED CIRCUIT APPARATUS AND RADIO-FREQUENCY POWER AMPLIFIER MODULE

BACKGROUND OF THE INVENTION

1. Field of the Invention

The present invention relates to semiconductor integrated circuit apparatuses and radio-frequency power amplifier modules. In particular, the present invention relates to a technology effectively applied to a semiconductor integrated circuit apparatus and a radio-frequency power amplifier module that include detection circuits of transmission power and that support multiple communication methods.

2. Description of the Related Art

For example, Japanese Unexamined Patent Application Publication No. 2006-324878 discloses a radio communication apparatus including different power amplifier circuits for different communication methods (for example, Global System for Mobile communications (GSM) (registered trademark) and Universal Mobile Telecommunications System (UMTS)). Japanese Unexamined Patent Application Publication No. 2001-211125 discloses a detection circuit that appropriately adjusts the range of a thermal detection circuit having a narrow dynamic range by using the result of detection by a Received Signal Strength Indicator (RSSI) detection circuit having a wide dynamic range. Japanese Unexamined Patent Application Publication No. 2009-284034 discloses a configuration including a first detector that detects output power from a final-stage amplifier circuit and a second detector that detects source-drain voltage of the final-stage amplifier circuit. In such a configuration, input power from an upstream variable gain amplifier is controlled in accordance with the result of addition of detected signals from the respective detectors.

Multi-mode (for example, multiple modes including GSM and Wideband Code Division Multiple Access (W-CDMA)) and multi-band (multiple frequency bands) radio communication terminals (cellular phones) that support multiple communication methods and multiple frequency bands are in widespread use in recent years. The communication methods include GSM, Enhanced Data Rates for GSM Evolution (EDGE), UMTS or W-CDMA, and Long Term Evolution (LTE). EDGE is a method resulting from extension of GSM, and a modulation method resulting from modification of 8-phase shift keying (8PSK) is used in EDGE, in addition to a Gaussian filtered Minimum Shift Keying (GMSK) modulation method. Such a radio communication terminal is required to be capable of stable communication against reduction in size and change in external environment.

For example, a radio-frequency power amplifier module used in a transmission system of the radio communication terminal is required to have characteristics for stably transmitting amplified output power having a value within a communication standard even in a state in which the change in external environment (a change in temperature, a variation in battery voltage, impedance mismatching between an antenna and the space, etc.) occurs. In order to suppress the variation in the output power, the power amplifier module usually includes a radio-frequency power amplifier (a power amplifier circuit) (PA) and a detection circuit that detects the magnitude of an output power signal (Pout) of the power amplifier circuit (PA). The detection circuit includes, for example, a directional coupler that generates a detected power signal (Pdet) using electromagnetic field coupling with Pout and a power detection circuit that generates a detected voltage signal (Vdet) corresponding to the magnitude of Pdet.

A review by the inventor of the above-described modules and methods determined the following. In the GSM mode, a feedback control method is usually used to control the output power from the power amplifier circuit (PA). Specifically, for example, an error amplifier detects the difference between a target value (a power instruction signal VRAMP) of the output power signal (Pout) of the power amplifier circuit (PA) and the detected voltage signal (Vdet) of Pout by the detection circuit, and the gain of PA is subjected to the feedback control so that the difference comes close to zero. If the detection sensitivity of the power detection circuit is low (that is, the relationship between Pdet (Pout) and Vdet is inappropriate), the controllability of Pout with VRAMP is reduced, thereby possibly increasing the variation in Pout. It is desirable in the GSM mode to use the detection method enabling high sensitive power detection in both a low power region and a high power region because the wide-range power control is required in the GSM mode.

In contrast, in the EDGE mode, the feedback control method described above is not usually used. The detected voltage signal (Vdet) is output from a terminal outside the module and is used for the gain control in a variable gain amplifier circuit positioned upstream of PA outside the module. Such a method is used in the EDGE mode because envelope line variation occurs, unlike the GSM mode (GMSK modulation) in which constant envelope line modulation is used, and linear amplification is required in conjunction with the envelope line variation. In this method, power measurement of Pout is alternatively performed via Vdet output from the terminal outside the module and the gain control of the variable gain amplifier circuit (that is, control of an input power signal (Pin) of PA) is performed on the basis of the result of the measurement. In the control, it is necessary to know in advance the detection sensitivity of the power detection circuit (the relationship between Pdet (Pout) and Vdet). If the relationship becomes complicated, the controllability of Pin is reduced, thereby possibly increasing the variation in Pout. Accordingly, it is desirable in the EDGE mode to use a detection method in which the relationship between Pdet (Pout) and Vdet is represented by a simple function in the power detection circuit.

The relationship between Pdet (Pout) and Vdet may be practically varied in accordance with the variation in the process, various variations in the environment, or the like. Accordingly, in order to correct the variation, it is necessary to perform calibration in advance. In the calibration, the actual measurement is performed at multiple predetermined calibration points and an approximate expression between Pdet (Pout) and Vdet is calculated on the basis of the result of the measurement. If the relationship between Pdet (Pout) and Vdet is complicated, the number of the calibration points is possibly increased and/or the precision of the approximate expression is possibly reduced. Accordingly, also in terms of this point, it is desirable to use a detection method in which the relationship between Pdet (Pout) and Vdet is represented by a simple function in the power detection circuit.

As described above, in the suppression of the variation in the output power signal (Pout), there are cases in which different detection methods are required to be used for different modes because the desired detection method of the power detection circuit is varied depending the communication method (mode). However, since different power detection circuits are usually separately mounted for different detection methods in such cases, the radio communication terminal is possibly increased in size, in addition to the increase in the circuit area.

SUMMARY OF THE INVENTION

In view of the above-described problems, preferred embodiments of the present invention provide a semiconductor integrated circuit apparatus and a radio-frequency power amplifier module in which multiple detection methods are capable of being realized in a small area.

In the inventions disclosed in the present application, typical preferred embodiments will herein be roughly and simply described.

A semiconductor integrated circuit apparatus according to a preferred embodiment includes N-number first amplifier circuits (AMP4 to AMP1), N-number first level detection circuits (DET4 to DET1), a first adder circuit (ADD1), a second level detection circuit (DET6), a synthesizer circuit (SYNS), and a current-voltage conversion circuit (IVC). The N-number first amplifier circuits receive a first power signal (Pdet), are cascade-connected in order from a first stage circuit (AMP4) to an N-th stage circuit (AMP1), and have a first gain. The N-number first level detection circuits are provided for the N-number first amplifier circuits and output currents in accordance with output levels of the first stage circuit to the N-th stage circuit of the N-number first amplifier circuits. The first adder circuit adds the output currents from the N-number first level detection circuits to each other to output a first current resulting from the addition. The second level detection circuit receives the first power signal (Pdet) to output a second current in accordance with a level of the first power signal. The synthesizer circuit generates a third current resulting from multiplication of the first current by a first value (WT1) and a fourth current resulting from multiplication of the first current by a second value (WT2) lower than the first value and generates a fifth current resulting from multiplication of the second current by a third value (WT3) and a sixth current resulting from multiplication of the second current by a fourth value (WT4) lower than the third value to output current resulting from addition (ADD11) of either of the third current and the fourth current to either of the fifth current and the sixth current. The current-voltage conversion circuit converts the output current from the synthesizer circuit into voltage.

With the above configuration, it is possible to realize the multiple detection methods within a small area. Specifically, for example, log detection is enabled in a first mode in which the third current is added to the sixth current and log-linear detection is enabled in a second mode in which the fourth current is added to the fifth current.

A semiconductor integrated circuit apparatus according to another preferred embodiment includes N-number first amplifier circuits, a second amplifier circuit, N-number first level detection circuits, second and third level detection circuits, first to fourth adder circuits, first to fifth multiplier circuits, first and second control circuits, and a current-voltage conversion circuit. The N-number first amplifier circuits receive a first power signal (Pdet), are cascade-connected in order from a first stage circuit (AMP4) to an N-th stage circuit (AMP2), and have a first gain. The second amplifier circuit (AMP1) has the first gain and is connected downstream of the N-number first amplifier circuits. The N-number first level detection circuits (DET4 to DET2) are provided for the N-number first amplifier circuits and output currents in accordance with output levels of the first stage circuit to the N-th stage circuit of the N-number first amplifier circuits. The second level detection circuit (DET1) outputs current in accordance with an output level of the second amplifier circuit. The first adder circuit (ADD1) adds the output currents from the N-number first level detection circuits to each other.

The first multiplier circuit (MUL1) multiplies output current from the first adder circuit by a first coefficient. The second adder circuit (ADD2) adds output current from the first multiplier circuit to the output current from the second level detection circuit to output a first current resulting from the addition. The third level detection circuit (DET6) receives the first power signal (Pdet) to output a second current in accordance with a level of the first power signal. The second multiplier circuit (MUL2) outputs current resulting from multiplication of the first current by a second coefficient in a first mode. The third multiplier circuit (MUL5) outputs current resulting from multiplication of the first current by a third coefficient in a second mode. The first control circuit (SSW11) controls the output from the third multiplier circuit so as to be in an invalid state in the first mode and controls the output from the second multiplier circuit so as to be in the invalid state in the second mode. The third adder circuit (ADD3) adds the output current from the second multiplier circuit to the second current. The fourth multiplier circuit (MUL3) outputs current resulting from multiplication of output current from the third adder circuit by a fourth coefficient in the first mode. The fifth multiplier circuit (MUL6) outputs current resulting from multiplication of the output current from the third adder circuit by a fifth coefficient in the second mode. The second control circuit (SSW10) controls the output from the fifth multiplier circuit so as to be in the invalid state in the first mode and controls the output from the fourth multiplier circuit so as to be in the invalid state in the second mode. The fourth adder circuit (ADD6) adds the output currents from the fourth multiplier circuit and the fifth multiplier circuit to the output current from the third multiplier circuit. The current-voltage conversion circuit (IVC) converts output current from the fourth adder circuit into voltage. The third value (the coefficient of the MUL5) is smaller than the second value (the coefficient of the MUL2) and is smaller than ×1. The fifth value (the coefficient of the MUL6) is larger than ×1.

With the above configuration, it is possible to realize the multiple detection methods within a small area. Specifically, the log detection is enabled in the first mode and the log-linear detection is enabled in the second mode. In addition, it is possible to optimize the characteristics of the multiple detection methods by using the coefficient of each multiplier circuit.

One of the advantages of a typical preferred embodiment, among the inventions disclosed in the present application, is to realize the multiple detection methods within a small area.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 3A and 3B are graphs illustrating the result of comparison of detection methods in power detection circuit blocks in FIG. 2 wherein FIG. 3A is a graph schematically illustrating exemplary characteristics of a log detection method and a linear detection method and FIG. 3B is a graph schematically illustrating exemplary characteristics of a log-linear detection method.

FIG. 6A is an explanatory diagram illustrating input-output characteristics of a log detection unit side and FIG. 6B is an explanatory diagram illustrating the input-output characteristics of a log-linear detection unit side.

DETAILED DESCRIPTION OF THE PREFERRED EMBODIMENTS

Figure 1:
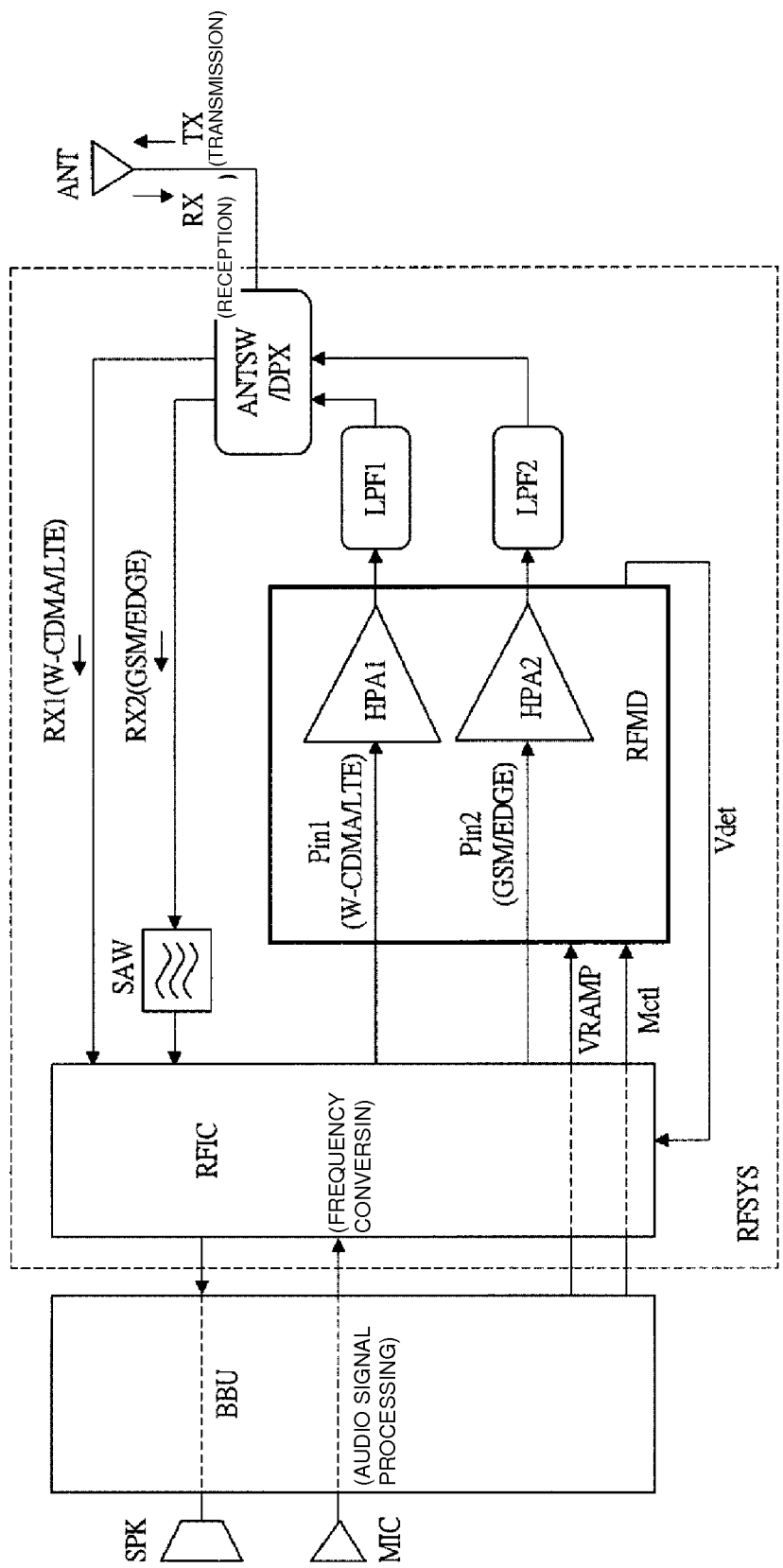
FIG. 1 is a block diagram illustrating an exemplary configuration of a cellular phone system to which a radio communication system according to a first preferred embodiment of the present invention is applied.

Although preferred embodiments are separated into multiple sections or preferred embodiments in the following description if needed for convenience, the sections or the preferred embodiments are not unrelated to each other unless explicitly indicated and part or all of the preferred embodiments are, for example, modification, detailed description, or supplementary explanation of the remaining preferred embodiments. When the number, etc. of elements (including the number of the elements, the numerical values thereof, the quantity thereof, and the range thereof) are described in the following preferred embodiments, the specific numbers are not limitedly used, unless explicitly indicated and unless it is apparent that the specific numbers are limitedly used in principle, and numbers or values higher than the specific numbers or numbers or values lower than the specific numbers may be used.

In addition, components (including steps and the like) are not necessarily required in the following preferred embodiments, unless explicitly indicated and unless it is apparent that the components are required in principle. Similarly, when the shapes, the positional relationship, or the like of the components, etc. is described in the following preferred embodiments, shapes or the likes substantially close to or similar to the shapes or the likes are included, unless explicitly indicated and unless otherwise considered in principle. The same applies to the numerical values and the range described above.

Furthermore, although the circuit elements defining functional blocks of the preferred embodiments are not restricted, the circuit elements are preferably provided on a semiconductor substrate made of, for example, single-crystal silicon by an integrated circuit technology, such as a known complementary metal oxide semiconductor (CMOS) transistor, for example. Although a metal oxide semiconductor field effect transistor (MOSFET) (abbreviated to a MOS transistor) is preferably used as an example of a metal insulator semiconductor field effect transistor (MISFET) in the preferred embodiments, a non-oxide film is not excluded as a gate insulating film. Although the connection of the substrate voltage of the MOS transistor is not explicitly illustrated in the drawings, the connection method is not specifically restricted as long as the MOS transistor normally operates.

The preferred embodiments of the present invention will herein be described in detail with reference to the attached drawings. The same reference numerals are used in all the drawing for describing the preferred embodiments to identify the same components and a repeated detailed description of the components is omitted herein.

First Preferred Embodiment

FIG. 1 is a block diagram illustrating an exemplary configuration of a cellular phone system to which a radio communication system according to a first preferred embodiment of the present invention is preferably applied. Referring to FIG. 1, the cellular phone system includes a baseband unit BBU, a radio-frequency system unit RFSYS, an antenna ANT, a speaker SPK, and a microphone MIC, and so on. The BBU, for example, converts an analog signal used in the SPK and the MIC into a digital signal, performs a variety of digital signal processing (modulation, demodulation, digital filtering, etc.) involved in communication, and outputs various control signals involved in the communication. The various control signals include a mode setting signal Mct1 for instructing a communication method (mode), such as GSM, EDGE, W-CDMA, or LTE, and a power instruction signal VRAMP for instructing target transmission power.

The RFSYS includes a radio-frequency signal processing apparatus RFIC, a surface acoustic wave (SAW) filter SAW, a radio-frequency power amplifier module RFMD, low pass filters LPF1 and LPF2, and an antenna switch ANTSW/duplexer DPX. The RFIC includes one semiconductor chip including, for example, a transmission mixer circuit, a reception mixer circuit, and a low noise amplifier circuit (LNA) and performs, for example, frequency conversion (up-conversion and down-conversion) between a baseband signal mainly used in the BBU and a radio-frequency signal used in the RFMD. The RFMD is realized by, for example, one module wiring substrate and radio-frequency power amplification apparatuses HPA1 and HPA2 mounted therein, which will be described in detail below.

The HPA1 receives a transmission signal for W-CDMA (or LTE) from the RFIC as an input power signal Pin1 to perform power amplification. The HPA2 receives a transmission signal for GSM/EDGE from the RFIC as an input power signal Pin2 to perform the power amplification. The RFMD receives the mode setting signal Mct1, the power instruction signal VRAMP, which are described above, and so on to operate the HPA1 or the HPA2 in response to the mode setting signal Mct1, the power instruction signal VRAMP, and so on that are received. In addition, the RFMD detects the level of an output power signal from the HPA1 or the HPA2 to supply a detected voltage signal Vdet resulting from the detection to the RFIC.

The LPF1 removes an unnecessary harmonic component from the output power signal from the HPA1 and supplies the signal resulting from the removal of the unnecessary harmonic component to the ANTSW/DPX. The LPF2 removes an unnecessary harmonic component from the output power signal from the HPA2 and supplies the signal resulting from the removal of the unnecessary harmonic component to the ANTSW/DPX. The ANTSW controls the connection destination (for example, a transmission or reception path for GSM or a transmission or reception path for W-CDMA, etc.) of the antenna ANT on the basis of a switch switching signal (not illustrated). The DPX, for example, divides a transmission signal and a reception signal in accordance with certain transmission and reception frequency bands in the W-CDMA (or LTE) mode. For example, in the W-CDMA (or LTE) mode, the output power signal from the HPA1 is transmitted to the ANT via the DPX and the ANTSW as a transmission signal TX and a reception signal RX received with the ANT is input into the RFIC via the ANTSW and the DPX as a reception signal RX1. In contrast, in the GSM mode or the EDGE mode, the output power signal from the HPA2 is transmitted to the ANT via the ANTSW as the TX and the RX received with the ANT is supplied to the SAW via the ANTSW as a reception signal RX2. The SAW extracts the signal within a certain reception frequency band from the RX2 and supplies the extracted signal within the reception frequency band to the RFIC.

Figure 2:
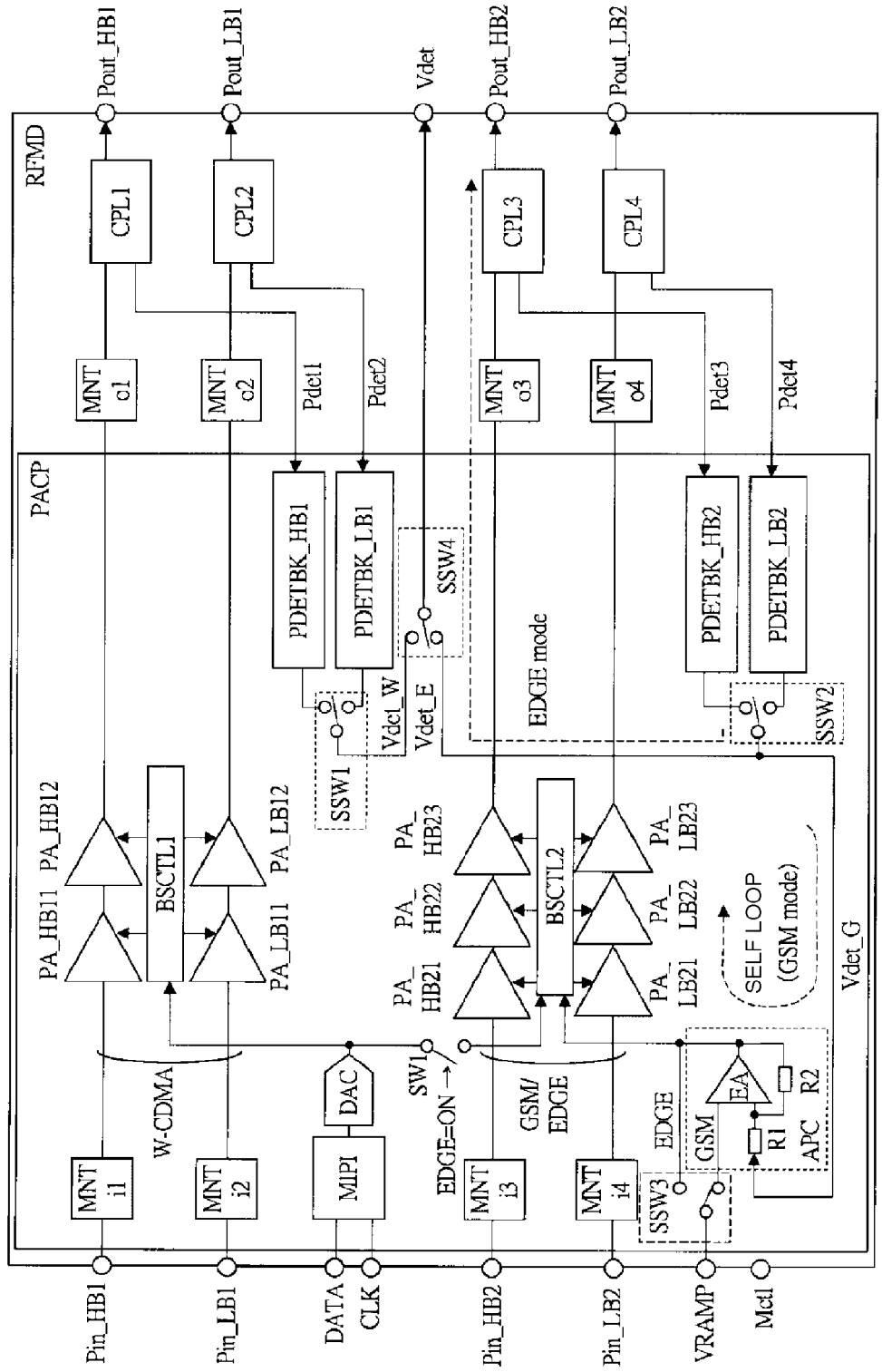
FIG. 2 is a block diagram illustrating an exemplary configuration of a radio-frequency power amplifier module in the radio communication system in FIG. 1.

FIG. 2 is a block diagram illustrating an exemplary configuration of the radio-frequency power amplifier module in the radio communication system in FIG. 1. The radio-frequency power amplifier module RFMD illustrated in FIG. 2 preferably includes, for example, one module wiring substrate (for example, a ceramic wiring substrate). A semiconductor chip (semiconductor integrated circuit apparatus) PACP is mounted on the wiring substrate, and output matching circuits MNTo1 to MNTo4 and directional couplers CPL1 to CPL4 are provided on the wiring substrate. The MNTo1 to MNTo4 and the CPL1 to CPL4 are realized by, for example, the wiring patterns on the wiring substrate or a combination of, for example, surface mount device (SMD) components including a capacitor and a coil with the wiring patterns in some cases.

The RFMD receives seven input signals (Pin_HB1, Pin_LB1, DATA and CLK, Pin_HB2, Pin_LB2, VRAMP, and Mct1) from the outside and outputs five output signals (Pout_HB1, Pout_LB1, Vdet, Pout_HB2, and Pout_LB2) to the outside. The Pin_HB1 and the Pin_LB1 are input power signals for W-CDMA (or LTE) corresponding to the Pin1 in FIG. 1. The Pin_HB1 is for a high band (for example, a 2.1-GHz band) and the Pin_LB1 is for a low band (for example, an 800-MHz band). The DATA and the CLK are a data signal and a clock signal, respectively, for serial communication. The Pin_HB2 and the Pin_LB2 are input power signals for GSM/EDGE corresponding to the Pin2 in FIG. 1. The Pin_HB2 is for a high band and the Pin_LB2 is for a low band.

Specifically, the Pin_HB2 corresponds to transmission signals for, for example, digital cellular system (DCS) 1800 (transmission frequency band: 1,710 MHz to 1,785 MHz and reception frequency band: 1,805 MHz to 1,880 MHz) and personal communication service (PCS) 1900 (transmission frequency band: 1,850 MHz to 1,910 MHz and reception frequency band: 1,930 MHz to 1,990 MHz). The Pin_LB2 corresponds to transmission signals for, for example, GSM850 (transmission frequency band: 824 MHz to 849 MHz and reception frequency band: 869 MHz to 894 MHz) and GSM900 (transmission frequency band: 880 MHz to 915 MHz and reception frequency band: 925 MHz to 960 MHz). The VRAMP is the power instruction signal for setting the target value of the transmission power (TX in FIG. 1) from the antenna. The Mct1 is the mode setting signal for instructing a communication method (mode), such as GSM, EDGE, W-CDMA, or LTE.

The Pout_HB1 and the Pout_LB1 are output power signals for W-CDMA (or LTE) corresponding to the output from the HGA1 in FIG. 1. The Pout_HB1 is for a high band (for example, a 2.1-GHz band) and the Pout_LB1 is for a low band (for example, an 800-MHz band). The Pout_HB2 and the Pout_LB2 are output power signals for GSM/EDGE corresponding to the output from the HPA2 in FIG. 1. The Pout_HB2 is for high bands (DCS1800 and PCS1900) and the Pout_LB2 is for low bands (GSM850 and GSM900). The Vdet is the detected voltage signal resulting from the detection of the power level of any of the output power signals.

The semiconductor chip (semiconductor integrated circuit apparatus) PACP includes input matching circuits MNTi1 to MNTi4; power amplifier circuits PA_HB11, PA_HB12, PA_LB11, PA_LB12, PA_HB21 to PA_HB23, and PA_LB21 to PA_LB23; and bias control circuits BSCTL1 and BSCTL2. The PA_HB11 and the PA_HB12 are cascaded-connected to each other in a two-stage configuration. The PA_HB11 and the PA_HB12 amplify the Pin_HB1 input through the MNTi1 to output the amplified Pin_HB1 via the MNTo1 outside the chip. Similarly, the PA_LB11 and the PA_LB12 are cascaded-connected to each other in the two-stage configuration. The PA_LB11 and the PA_LB12 amplify the Pin_LB1 input through the MNTi2 to output the amplified Pin_LB1 via the MNTo2 outside the chip.

The PA_HB21 to PA_HB23 are cascaded-connected to each other in a three-stage configuration. The PA_HB21 to PA_HB23 amplify the Pin_HB2 input through the MNTi3 to output the amplified Pin_HB2 via the MNTo3 outside the chip. Similarly, the PA_LB21 to PA_LB23 are cascaded-connected to each other in the three-stage configuration. The PA_LB21 to PA_LB23 amplify the Pin_LB2 input through the MNTi4 to output the amplified Pin_LB2 via the MNTo4 outside the chip. The BSCTL1 controls the gains (specifically, bias current and bias voltage) of the PA_HB11, the PA_HB12, the PA_LB11, and the PA_LB12. The BSCTL2 controls the gains (specifically, bias current and bias voltage) of the PA_HB21 to PA_HB23 and the PA_LB21 to PA_LB23.

The output signal from the MNTo1 is the Pout_HB1, the output signal from the MNTo2 is the Pout_LB1, the output signal from the MNTo3 is the Pout_HB2, and the output signal from the MNTo4 is the Pout_LB2. Outside the chip, the CPL1 detects the power level of the Pout_HB1 by the electromagnetic field coupling to output the detected power level as a detected power signal Pdet1. Similarly, the CPL2 detects the power level of the Pout_LB1 to output a detected power signal Pdet2, the CPL3 detects the power level of the Pout_HB2 to output a detected power signal Pdet3, and the CPL4 detects the power level of the Pout_LB2 to output a detected power signal Pdet4.

The semiconductor chip PACP also includes a serial control circuit MIPI, a digital-to-analog conversion circuit DAC, an automatic power control circuit APC, a switch SW1, selective switches SSW1 to SSW4, and power detection circuit blocks PDETBK_HB1, PDETBK_LB1, PDETBK_HB2, and PDETBK_LB2. The MIPI controls the serial communication with the DATA and the CTL. The DAC converts a digital signal acquired by the serial communication to an analog signal. The analog signal is capable of being supplied to the BSCTL1 and to the BACTL2 through the SW1.

The PDETBK_HB1 receives the Pdet1 from the CPL1 to output a voltage signal corresponding to the power level of the Pdet1. The PDETBK_LB1 receives the Pdet2 from the CPL2 to output a voltage signal corresponding to the power level of the Pdet2. The SSW1 selects the voltage signal from either of the PDETBK_HB1 and the PDETBK_LB1 to output the selected voltage signal as a detected voltage signal Vdet_W. The PDETBK_HB2 receives the Pdet3 from the CPL3 to output a voltage signal corresponding to the power level of the Pdet3. The PDETBK_LB2 receives the Pdet4 from the CPL4 to output a voltage signal corresponding to the power level of the Pdet4. The SSW2 selects the voltage signal from either of the PDETBK_HB2 and the PDETBK_LB2 to output the selected voltage signal as detected voltage signals Vdet_E and Vdet_G.

The automatic power control circuit APC is a negative feedback amplifier circuit including an error amplifier EA, a series resistor R1, and a feedback resistor R2. The VRAMP is input into one of the inputs of the EA via the SSW3 and the Vdet_G is input into the other of the inputs of the EA via the R1. The EA detects the difference between the two inputs to control the BSCTL2 on the basis of the result of the detection. The SSW3 is used to switch the VRAMP to the input node of the EA or the output node of the EA. The SSW4 selects either of Vdet_W and Vdet_E to output the selected signal to the outside (the RFIC in FIG. 1) as the detected voltage signal Vdet. The selection by the SSW1 to SSW4 and turning on or off of the SW1 are appropriately controlled in accordance with the mode setting signal Mct1 supplied from the outside.

In the above configuration, for example, in the GSM mode, either of the PA_HB21 to PA_HB23 and the PA_LB21 to PA_LB23 is activated in accordance with the frequency band (practically, the instruction of the Mct1) to generate either of the Pout_HB2 and the Pout_LB2. Provided that the high band side is selected, the Pdet_3 is generated in accordance with the power level of the Pout_HB2. The PDETBK_HB2 receives the Pdet3 to output the Vdet_G via the SSW2. The EA detects the difference between the Vdet_G and the VRAMP input through the SSW3 to output the result of the detection to the BSCTL2. The BSCTL2 controls the gains of the PA_HB21 to PA_HB23 in accordance with the result of the detection in the EA. Such feedback control (self loop) allows the power level of the Pout_HB2 to be controlled in accordance with the VRAMP.

In the EDGE mode, as in the GSM mode, either of the PA_HB21 to PA_HB23 and the PA_LB21 to PA_LB23 is activated to generate either of the Pout_HB2 and the Pout_LB2. Provided that the high band side is selected, the Pdet3 is generated in accordance with the power level of the Pout_HB2 and the PDTBK_HB2 receives the Pdet3 to output the Vdet_E via the SSW2. The Vdet_E is output to the outside (the RFIC in FIG. 1) through the SSW4 in the EDGE mode, unlike the GSM mode. The gain of a variable gain amplifier circuit (not illustrated) included in the RFIC in FIG. 1 is controlled on the basis of the Vdet_E to control the power level of the Pin_HB2.

At this time, the VRAMP is supplied to the BSCTL2 through the SSW3 or the analog signal from the DAC is supplied to the BSCTL2 through the SW1. The VRAMP or the analog signal in this case has fixed voltage for fixing the PA_HB21 to PA_HB23 to an optimal bias point (that is, an operation point capable of being linearly amplified in response to the input power). The power level of the Pout_HB2 is controlled on the basis of the power level of the Pin_HB2.

In the W-CDMA (or LTE) mode, either of the PA_HB11 and PA_HB12 and the PA_LB11 and PA_LB12 is activated in accordance with the frequency band (practically, the instruction of the Mct1) to generate either of the Pout_HB1 and the Pout_LB1. Provided that the high band side is selected, the Pdet_1 is generated in accordance with the power level of the Pout_HB1. The PDETBK_HB1 receives the Pdet1 to output the Vdet_W via the SSW1. The Vdet_W is output to the outside (the RFIC in FIG. 1) through the SSW4 also in the W-CDMA (or LTE) mode, as in the EDGE mode, and the gain of the variable gain amplifier circuit (not illustrated) included in the RFIC in FIG. 1 is controlled on the basis of the Vdet_W. As a result, the power level of the Pin_HB1 is controlled to control the power level of the Pout_HB1. The analog signal from the DAC is supplied to the BSCTL1, and the BSCTL1 controls the PA_HB11 and the PA_HB12 so as to be set to an optimal bias point in response to the analog signal.

Although the power amplifier circuits for W-CDMA (or LTE) and the power amplifier circuits for GSM/EDGE are mounted on the same semiconductor chip in the example in FIG. 2, the power amplifier circuits for W-CDMA (or LTE) and the power amplifier circuits for GSM/EDGE may be mounted on separate chips in some cases. Specifically, the power amplifier circuits for GSM/EDGE can easily meet a communication standard by using, for example, a laterally diffused MOS (LDMOS) while the power amplifier circuits for W-CDMA (or LTE) may require a high-performance transistor, such as a heterojunction bipolar transistor (HBT), in order to meet the communication standard.

As described above, in the radio-frequency power amplifier module RFMD supporting the multiple communication methods (multi-mode) and the multiple frequency bands (multi-band), the power detection circuit blocks are provided for the respective frequency bands. In the example in FIG. 2, for example, the PDETBK_HB2 and the PDETBK_LB2 are provided for the high band and the low band of GSM, respectively. This is because, in the power detection circuit block, the wide variation in the frequency band of the input signal (Pdet) may possibly vary the detection sensitivity (Pdet-Vdet characteristics) greatly due to the frequency characteristics and so on of the internal circuit and it is not easy to share the power detection circuit block between the high band and the low band.

It is necessary for each of the PDETBK_HB2 and the PDETBK_LB2 to support both the GSM mode and the EDGE mode and, in order to support both the GSM mode and the EDGE mode, it is desirable to use the detection method appropriate for each mode, as described above. To this end, the power detection circuit block supporting the GSM mode and the power detection circuit block supporting the EDGE mode are practically provided in, for example, the PDET-BK_HB2. This may possibly increase the circuit area of the entire power detection circuit block. Accordingly, it is required to realize the detection method appropriate for each mode and to adopt a technology capable of reducing the circuit size.

Figure 3A:
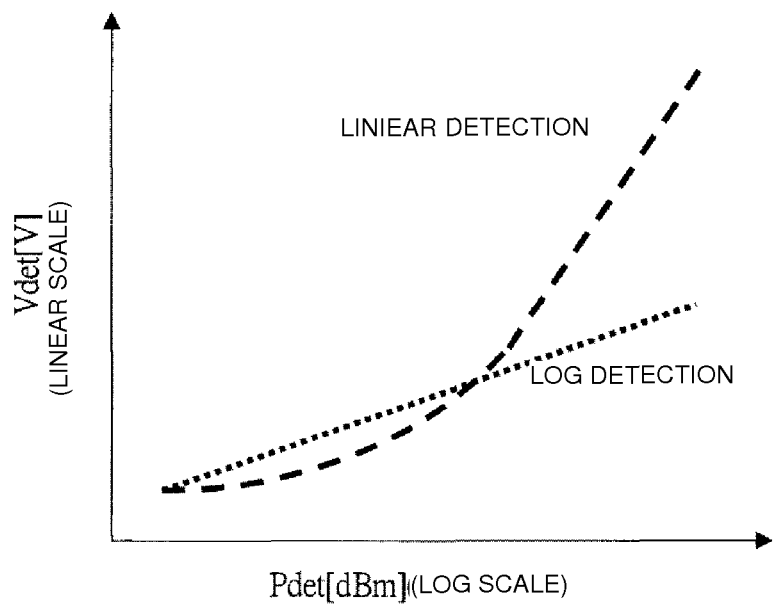

It is desirable that each of the power detection circuit blocks PDETBK_HB2 and PDETBK_LB2 use a log (logarithm)-linear detection method that is useful to suppress the variation in the output power signals Pout_HB2 and Pout_LB2 in the GSM mode. In the log-linear detection method, the PDETBK_HB2 detects the magnitude of the detected power signal Pdet3 and the PDETBK_LB2 detects the magnitude of the detected power signal Pdet4 by using a log scale at the low power side and a linear scale at the high power side. FIG. 3 includes graphs illustrating the result of comparison of the detection methods in the power detection circuit blocks in FIG. 2. FIG. 3A is a graph schematically illustrating exemplary characteristics of a log detection method and a linear detection method and FIG. 3B is a graph schematically illustrating exemplary characteristics of the log-linear detection method.

Figure 3B:
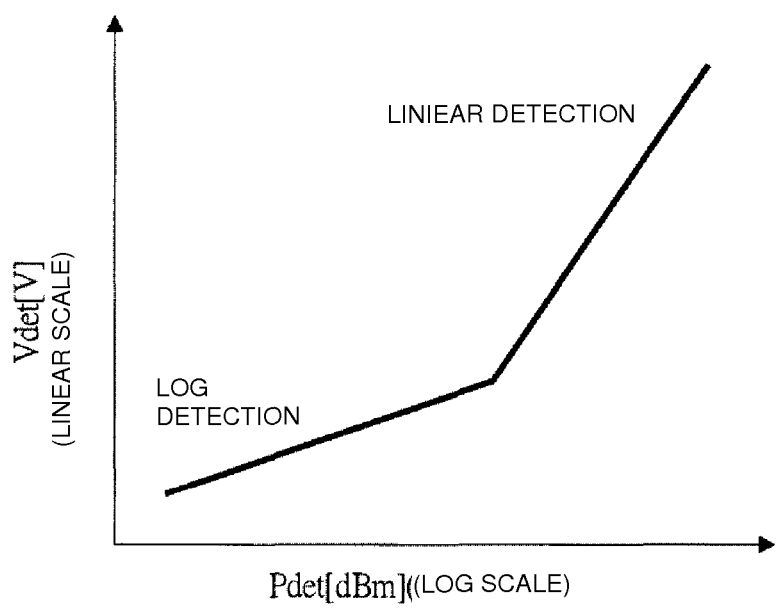

FIGS. 3A and 3B illustrate the Pdet-Vdet characteristics, in which the horizontal axis represents the detected power signal Pdet (dBm) (the log scale) and the vertical axis represents the detected voltage signal Vdet (V) (the linear scale). As illustrated in FIG. 3A, when the linear detection method (the detection method in which the Pdet-Vdet characteristics have proportional relationships when the linear scale is applied to both the horizontal axis and the vertical axis) is used, the Pdet-Vdet characteristics are in an exponential manner when the horizontal axis is viewed at the log scale. In contrast, when the log detection method is used, the Pdet-Vdet characteristics have the proportional relationship. FIG. 3(a) indicates that the detection sensitivity at the high power side is increased although the detection sensitivity at the low power side (the side at which the level of the Pdet (Pout) is low) is low when the linear detection method is used while the detection sensitivity at the low power side is increased although the detection sensitivity at the high power side is low when the log detection method is used. Accordingly, the use of the log-linear detection method illustrated in FIG. 3B by combining the linear detection method with the log detection method allows the detection sensitivity to be increased over a wide range from the low power region to the high power region.

Figure 4:
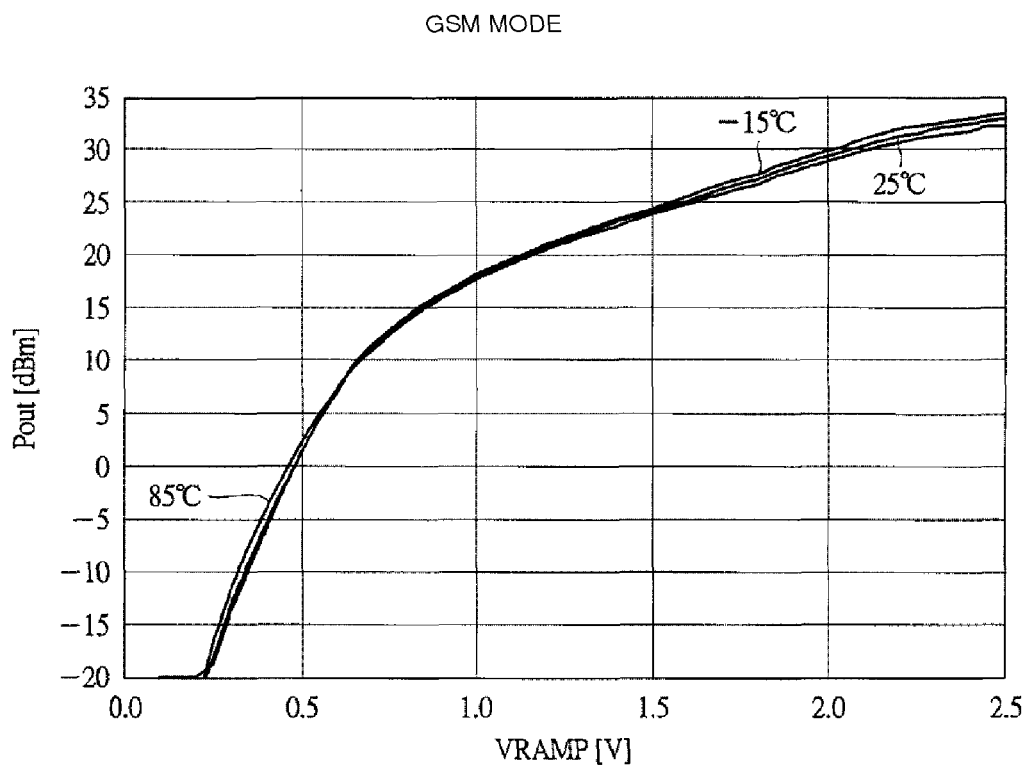
FIG. 4 is a graph illustrating an example of typical power control characteristics in a GSM mode in the radio-frequency power amplifier module in FIG. 2.

FIG. 4 is a graph illustrating an example of typical power control characteristics in the GSM mode in the radio-frequency power amplifier module in FIG. 2. FIG. 4 illustrates an example of the typical characteristics of the Pout with respect to the VRAMP, in which the horizontal axis represents the power instruction signal VRAMP (V) (the linear scale) and the vertical axis represents the output power signal Pout (dBm) (the log scale). The characteristics at different temperatures T (−15° C., 25° C., and 85° C.) are illustrated in FIG. 4. When the log-linear detection method illustrated in FIG. 3B is applied, the slope of the Pout with respect to the VRAMP is steep toward the low power and is gentle toward the high power, as illustrated in FIG. 4. In other words, the characteristics in which the horizontal axis is replaced with the vertical axis in FIG. 3B are achieved. In this case, since the high-sensitive detected voltage signal Vdet is achieved over the wide range from the power detection circuit block, as described above with reference to FIG. 3B, it is possible to realize the high-precision power control by using the VRAMP via the error amplifier EA in FIG. 2, so as to reduce the variation in the output power signal Pout.

In contrast, in the EDGE mode, the feedback control using the automatic power control circuit APC is not performed, the power measurement of the Pout is alternatively performed via the detected voltage signal Vdet, and the gain control of the variable gain amplifier circuit in the RFIC in FIG. 1 is performed on the basis of the result of the measurement, as described above. Accordingly, it is useful to use the log detection method capable of easily approximating the relationship between the detected power signal Pdet (Pout) and the Vdet by using a linear function in the EDGE mode, as illustrated in FIG. 3A. The use of the log detection method allows the gain control of the variable gain amplifier circuit in the RFIC in FIG. 1 to be appropriately performed and allows the calibration of the relationship between the Pdet (Pout) and the Vdet to be easily or precisely performed, as described above. As a result, it is possible to reduce the variation in the output power signal Pout. Since the gain control of the variable gain amplifier circuit may be performed by using the linear function relationship between the Vdet and the Pdet at the linear scale in the EDGE mode, the linear detection method may be used in some cases.

Figure 5:
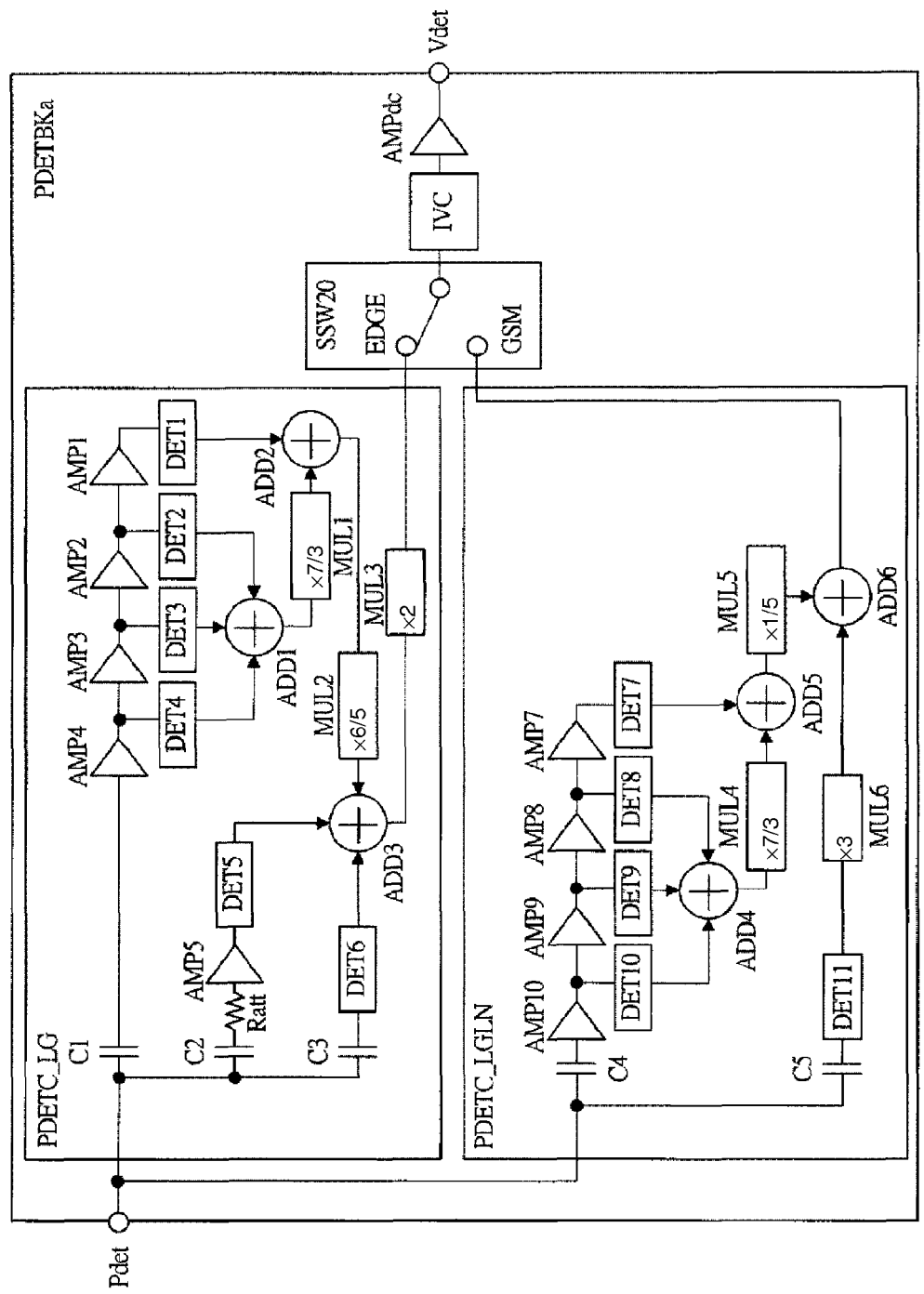
FIG. 5 is a circuit block diagram illustrating an exemplary configuration of a power detection circuit block in the radio-frequency power amplifier module in FIG. 2.
Figure 6A:
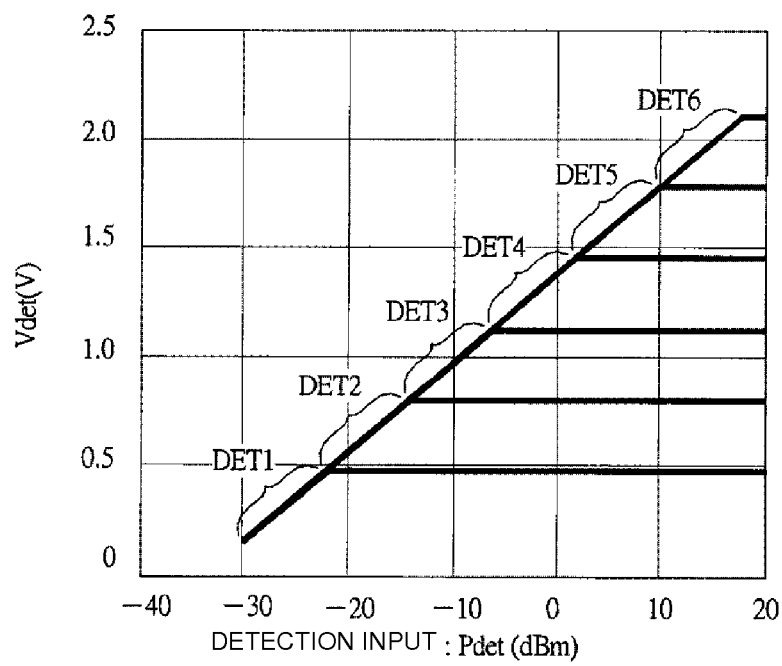
FIGS. 6A and 6B are graphs illustrating an example of the operation of the power detection circuit block in FIG. 5.
Figure 6B:
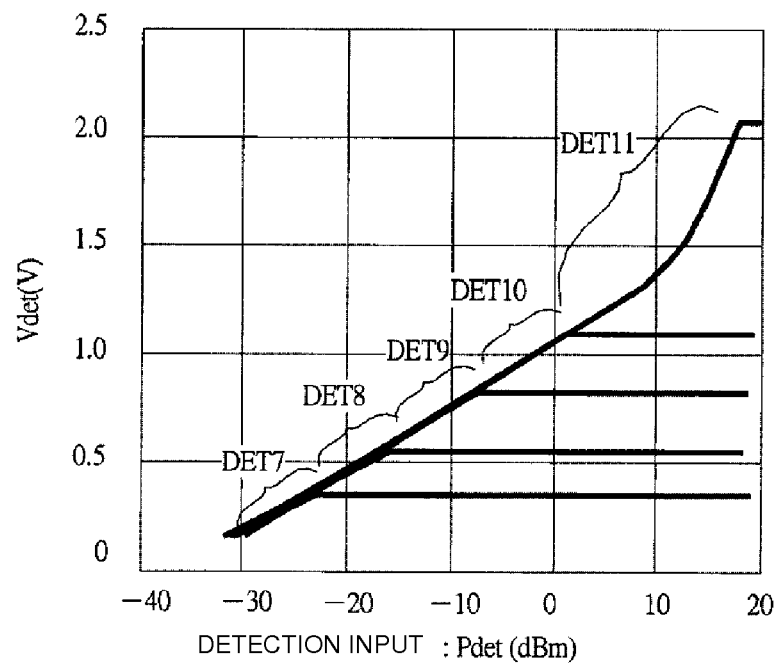

FIG. 5 is a circuit block diagram illustrating an exemplary configuration of a power detection circuit block in the radio-frequency power amplifier module in FIG. 2. FIGS. 6A and 6B are graphs illustrating an example of the operation of the power detection circuit block in FIG. 5. FIG. 6A is an explanatory diagram illustrating input-output characteristics of a log detection unit side and FIG. 6B is an explanatory diagram illustrating the input-output characteristics of a log-linear detection unit side. Referring to FIG. 5, a power detection circuit block PDETBKa corresponds to the PDETBK_LB2 (or PDETBK_HB2) in FIG. 2. The power detection circuit block PDETBKa includes a log (logarithm) detection unit PDETC_LG, a log-linear detection unit PDETC_LGLN, a selective switch SSW20, a current-voltage conversion circuit IVC, and a DC amplifier circuit AMPdc. The SSW20 is used to input the output from the PDETC_LG into the IVC in the EDGE mode and to input the output from the PDETC_LGLN into the IVC in the GSM mode. The output from the IVC is output via the AMPdc as the detected voltage signal Vdet.

The log detection unit PDETC_LG includes multiple alternating-current coupling capacitors C1 to C3, multiple amplifier circuits AMP1 to AMP5, multiple level detection circuits DET1 to DET6, multiple multiplier circuits MUL1 to MUL3, multiple adder circuits ADD1 to ADD3, and an attenuation resistor (attenuator circuit) Ratt. The detected power signal Pdet from the coupler CPL in FIG. 2 is input into the AMP4 through the C1. The AMP3, the AMP2, and the AMP1 are sequentially cascade-connected downstream of the AMP4. The DET1 to DET4 generate currents corresponding to the output levels of the AMP1 to AMP4, respectively.

The ADD1 adds the output currents from the DET2 to DET4. The MUL1 multiplies the output current from the ADD1 by a certain coefficient (×7/3 in this example). The ADD2 adds the output current from the MUL1 to the output current from the DET1. The MUL2 multiplies the output current from the ADD2 by a certain coefficient (×6/5 in this example). The Pdet is input into the AMP5 through the C2 and the attenuation resistor Ratt. The DET5 generates current corresponding to the output level of the AMP5. The Pdet is input into the DET6 through the C3 and the DET6 generates current corresponding to the input level of the Pdet. The ADD3 adds the output current from the MUL2, the output current from the DET5, and the output current from the DET6 to each other. The MUL3 multiplies the output current from the ADD3 by a certain coefficient (×2 in this example).

The amplifier circuits AMP1 to AMP5 have certain gain (for example, about 10 dB although not limiting), for example, of the same value. The amplifier circuits AMP1 to AMP5 each perform amplification with the gain within a range in which the output does not reach a certain saturated output voltage and each function as a limiter amplifier that constantly outputs the saturated output voltage within a range in which the output reaches the saturated output voltage. The Ratt is an attenuator having a certain gain (for example, about—several decibels). The operation will now be described on the basis of, for example, a case in which the level of the detected power signal Pdet is very low, the saturated output voltage is acquired only from the AMP1, and saturated output current corresponding to the saturated output voltage is acquired from the DET1.

Upon gradual increase in the level of the Pdet from this state, the output from the AMP2 mainly is greatly increased toward the saturated output voltage in a state in which the AMP1 outputs the saturated output voltage. In response to this, the output from the DET2 mainly is greatly increased toward the saturated output current in a state in which the DET1 outputs the saturated output current. When the amount of increase in the level of the Pdet reaches about 10 dB, for example, the output from the AMP2 reaches the saturated output voltage and the output from the DET2 also reaches the saturated output current in response to the output from the AMP2 which reaches the saturated output voltage. Similarly, each time the level of the Pdet is increased by about 10 dB, for example, the outputs from the AMP3, the AMP4, and the AMP5 sequentially reach the saturated output voltage and the outputs from the DET3, the DET4, and the DET5 sequentially reach the saturated output current. Then, upon further increase in the level of the Pdet, the output current from the DET6 is greatly increased.

Accordingly, the final addition of the output currents from the level detection circuits DET1 to DET6 by the ADD3 and the conversion of the current into the voltage by the current-voltage conversion circuit IVC allow the detected voltage signal Vdet proportional to the log scale of the Pdet to be acquired, as illustrated in FIG. 6A. In other words, it is possible to perform the log detection. The upper limit of the Vdet is restricted in FIG. 6A not because the output current from the DET6 is restricted but because the output voltage from, for example, the AMPdc is restricted.

The log-linear detection unit PDETC_LGLN includes multiple alternating-current coupling capacitors C4 and C5, multiple amplifier circuits AMP7 to AMP10, multiple level detection circuits DET7 to DET11, multiple multiplier circuits MUL4 to MUL6, and multiple adder circuits ADD4 to ADD6. The detected power signal Pdet from the coupler CPL in FIG. 2 is input into the AMP10 through the C4. The AMP9, the AMP8, and the AMP7 are sequentially cascade-connected downstream of the AMP10. The DET7 to DET10 generate currents corresponding to the output levels of the AMP7 to AMP10, respectively. The ADD4 adds the output currents from the DET8 to DET10 to each other. The MUL4 multiplies the output current from the ADD4 by a certain coefficient (×7/3 in this example). The ADD5 adds the output current from the MUL4 to the output current from the DET7. The MUL5 multiplies the output current from the ADD5 by a certain coefficient (×1/5 in this example). The Pdet is input into the DET11 through the C5 and the DET11 generates current corresponding to the input level of the Pdet. The MUL6 multiplies the output current from the DET11 by a certain coefficient (×3 in this example). The ADD6 adds the output current from the MUL5 to the output current from the MUL6.

A path from the outputs from the amplifier circuits AMP7 to AMP10 to the input into the ADD6 has substantially the same configuration as a path from the outputs from the AMP1 to AMP4 to the input into the ADD3 in the PDETC_LG described above. However, the coefficient (for example, ×1/5) of the MUL5 in the PDETC_LGLN is made smaller than the coefficient (for example, ×6/5) of the MUL2 in the PDETC_LG. Although the DET11 in the PDETC_LGLN corresponds to the DET6 in the PDETC_LG, the output current from the DET11 is multiplied (for example, ×3) by the MUL6 and, then, is input into the ADD6 in the PDETC_LGLN.

Accordingly, as illustrated in FIG. 6B, the Vdet proportional to the log scale of the Pdet is acquired within the detection range of the DET7 to DET10, which is the low power region, while the Vdet proportional to the linear scale of the Pdet is acquired (that is, the Vdet is increased in an exponential manner when the Pdet is represented at the log scale) within the detection range of the DET11, which is the high power region. In other words, it is possible to perform the log-linear detection. Comparison of FIG. 6B with FIG. 6A indicates that, in FIG. 6B, as described above, the coefficient (for example, ×1/5) of the MUL5 is made smaller than the coefficient (for example, ×6/5) of the MUL2 to suppress the sensitivity of the log detection range and the output from the DET11 is multiplied (for example, ×3) by the MUL6 to increase the sensitivity of the linear detection range.

As described above, the use of the exemplary configuration in FIG. 5 enables the log detection and the log-linear detection and the coefficients of the multiplier circuits MUL1 to MUL6 are appropriately varied to appropriately optimize the log detection characteristics and the log-linear detection characteristics, which will be described in detail below. For example, in the log detection, although a shift from the desired log detection characteristics practically occurs depending on the electrical characteristics of, for example, the amplifier circuits and the level detection circuits, such a shift can be corrected with the coefficients of the multiplier circuits. In the exemplary configuration in FIG. 5, the Ratt, the AMP5, and the DET5 are not necessarily required. The Ratt, the AMP5, and the DET5 may be omitted or the AMP5 and the DET5 may be provided upstream of the AMP4. However, for example, when the Ratt, the AMP5, and the DET5 are omitted, the linear function characteristics may not be acquired in a connection portion between the detection range of the DET4 and the detection range of the DET6 in FIG. 6A. Accordingly, the Ratt, the AMP5, and the DET5 are provided to easily realize the linear function characteristics in the connection portion.

Figure 7:
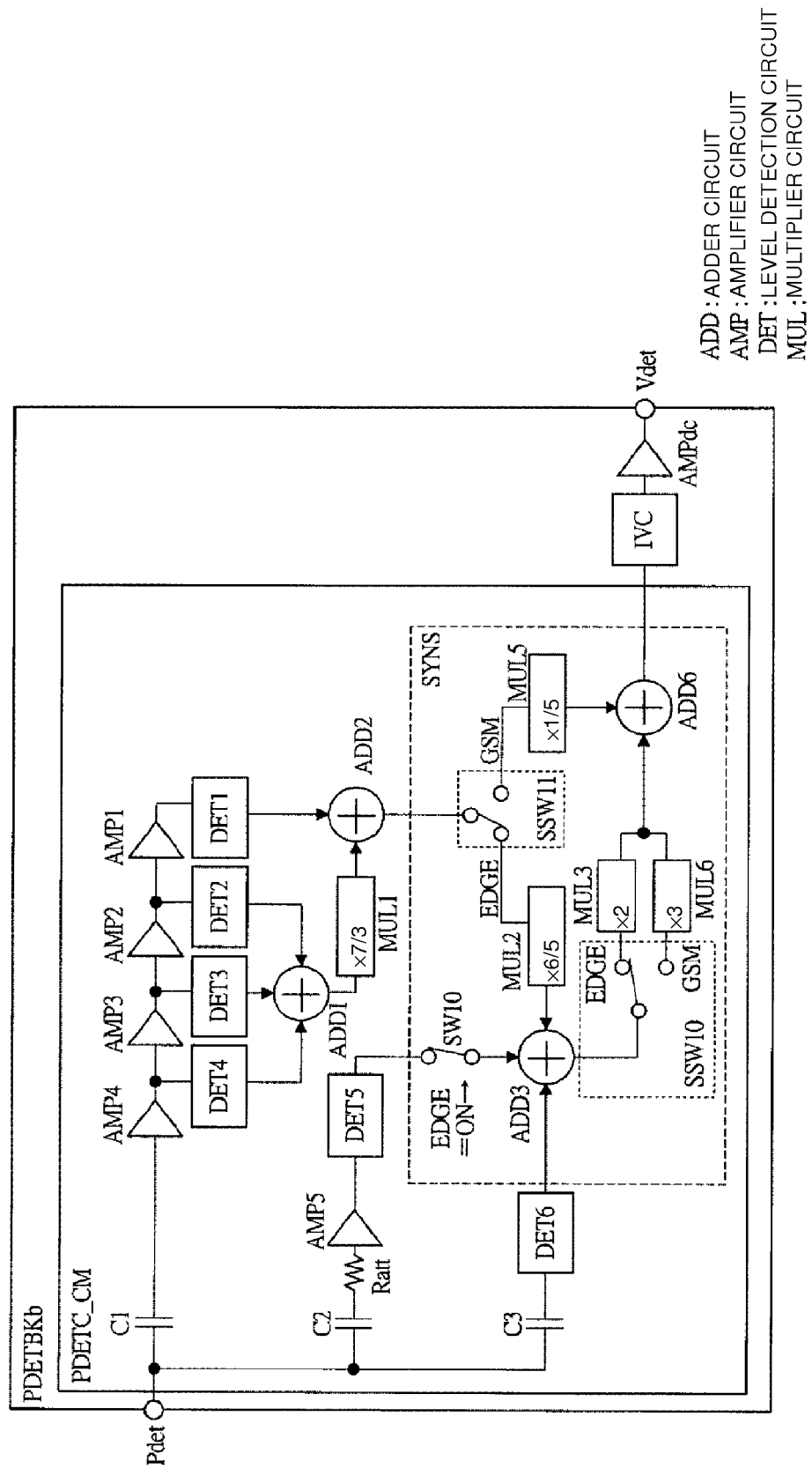
FIG. 7 is a circuit block diagram illustrating another exemplary configuration of the power detection circuit block in the radio-frequency power amplifier module in FIG. 2.

FIG. 7 is a circuit block diagram illustrating another exemplary configuration of the power detection circuit block in the radio-frequency power amplifier module in FIG. 2. As described above, although the use of the exemplary configuration in FIG. 5 enables the log detection and the log-linear detection, the separate provision of the log detection unit PDETC_LG and the log-linear detection unit PDETC_LGLN may increase the circuit area. Accordingly, it is useful to use the exemplary configuration in FIG. 7. Referring to FIG. 7, a power detection circuit block PDETBKb corresponds to the PDETBK_LB2 (or PDETBK_HB2) in FIG. 2. The power detection circuit block PDETBKb includes a common detection unit PDETC_CM, the current-voltage conversion circuit IVC, and the DC amplifier circuit AMPdc. The IVC converts the output current form the PDETC_CM into voltage to output the voltage via the AMPdc. The output voltage is the detected voltage signal Vdet.

The common detection unit PDETC_CM includes multiple alternating-current coupling capacitors C1 to C3, multiple amplifier circuits AMP1 to AMP5, multiple level detection circuits DET1 to DET6, multiple multiplier circuits MUL1 to MUL3, MUL5, and MUL6, multiple adder circuits ADD1 to ADD3 and ADD6, the attenuation resistor Ratt, a switch SW10, and multiple selective switches SSW10 and SSW11. The multiple adder circuits ADD3 and ADD6, the multiple multiplier circuits MUL2, MUL3, MUL5, and MUL6, the multiple selective switches SSW10 and SSW11, and the switch SW10 define a synthesizer circuit SYNS. The detected power signal Pdet from the coupler CPL in FIG. 2 is input into the AMP4 through the C1. The AMP3, the AMP2, and the AMP1 are sequentially cascade-connected downstream of the AMP4. The DET1 to DET4 generate currents corresponding to the output levels of the AMP1 to AMP4, respectively.

The ADD1 adds the output currents from the DET2 to the DET4 to each other. The MUL1 multiplies the output current from the ADD1 by a certain coefficient ($\times 7/3$ in this example). The ADD2 adds the output current from the MULT1 to the output current from the DET1. The SSW11 is used to switch the output current from the ADD2 to either of the MUL2 and the MUL5. The MUL2 multiplies the output current from the ADD2, which is input through the SSW11, by a certain coefficient ($\times 6/5$ in this example). The MUL5 multiplies the output current from the ADD2, which is input through the SSW11, by a certain coefficient ($\times 1/5$ in this example). The Pdet is input into the AMP5 through the C2 and the attenuation resistor Ratt. The DET5 generates current corresponding to the output level of the AMP5 to output the current via the SW10.

The Pdet is input into the DET6 through the C3 and the DET6 generates current corresponding to the input level of the Pdet. The ADD3 adds the output current from the DET5, which is input through the SW10, the output current from the DET6, and the output current from the MUL2 to each other. The SSW10 switches the output current from the ADD3 to either of the MUL3 and the MUL6. The MUL3 multiplies the output current from the ADD3, which is input through the SSW10, by a certain coefficient ($\times 2$ in this example). The MUL6 multiplies the output current from the ADD3, which is input through the SSW10, by a certain coefficient ($\times 3$ in this example). The ADD6 adds the output current from the MUL5, the output current from the MUL3, and the output current from the MUL6 to each other to supply the result of the addition to the current-voltage conversion circuit IVC.

In the common detection unit PDETC_CM, in the GSM mode, the switch SW10 is turned off, the selective switch SSW10 is controlled so as to be at the MUL6 side, and the selective switch SSW11 is controlled so as to be at the MUL5 side. In the EDGE mode, the SW10 is turned on, the SSW10 is controlled so as to be at the MUL3 side, and the SSW11 is controlled so as to be at the MUL2 side. The control of the SW10, the SSW10, and the SSW11 is performed on the basis of the mode setting signal Mct1 in FIG. 2. Controlling the switch and the selective switches in the above manner causes the PDETC_CM in the GSM mode to be equivalent to the log-linear detection unit PDETC_LGLN in FIG. 5 and causes the PDETC_CM in the EDGE mode to be equivalent to the log detection unit PDETC_LG in FIG. 5.

Comparison between FIG. 7 and FIG. 5 indicates that, in FIG. 7, the C4, the C5, the AMP7 to AMP10, the DET7 to DET11, the ADD4, the ADD5, and the MUL4 in the log-linear detection unit PDETC_LGLN in FIG. 5 are removed, instead of the addition of the SW10, the SSW10, and the SSW11. This allows the detection methods appropriate for the respective modes (the GSM mode and the EDGE mode) to be realized and also allows the reduction in the circuit area to be realized. Although the switches (the SW10, the SSW10, and the SSW11) are controlled to realize the switching between the modes, the switching method in FIG. 7 is not necessarily used and the switching method may be appropriately varied. The switching method in FIG. 7 may be varied to various methods including a method in which the MUL2, the MUL3, the MUL5, the MUL6, and the entire circuit of the DET5 are directly enabled or disabled depending on the mode and a method in which switches are provided at the output side of the MUL3 and the MUL6, instead of the SSW10.

As also described above with reference to FIG. 5, appropriately varying the coefficients of the multiplier circuits MUL1 to MUL3, MUL5, and MUL6 allows the log detection characteristics and the log-linear detection characteristics to be appropriately optimized. For example, the coefficient of the MUL1 is used to adjust the slope of the detection characteristics in the middle power region in both the log detection and the log-linear detection. The coefficient of the MUL2 is used to adjust the slope of the detection characteristics in the low and middle power regions in the log detection. The coefficient of the MUL3 is used to adjust the slope of the detection characteristics in the entire power region in the log detection. The coefficient of the MUL5 is used to adjust the slope of the detection characteristics in the low and middle power regions in the log-linear detection. The coefficient of the MUL6 is used to adjust the slope of the detection characteristics in the high power region in the log-linear detection.

The coefficient of each multiplier circuit is adjusted to acquire the linearity (the linear function characteristics) of the Pdet (Pout)-Vdet characteristics mainly illustrated in FIG. 6($a$) in the log detection (that is, the EDGE mode). In contrast, the coefficient of each multiplier circuit is adjusted to optimize the loop gain of the feedback path mainly involved in the automatic power control circuit APC in FIG. 2 in the log-linear detection (that is, the GSM mode). For example, oscillation may occur if the loop gain is too large and the variation in the Pout may be increased if the loop gain is too small. Accordingly, it is useful to optimize the loop gain with the coefficient of each multiplier circuit.

Figure 8:
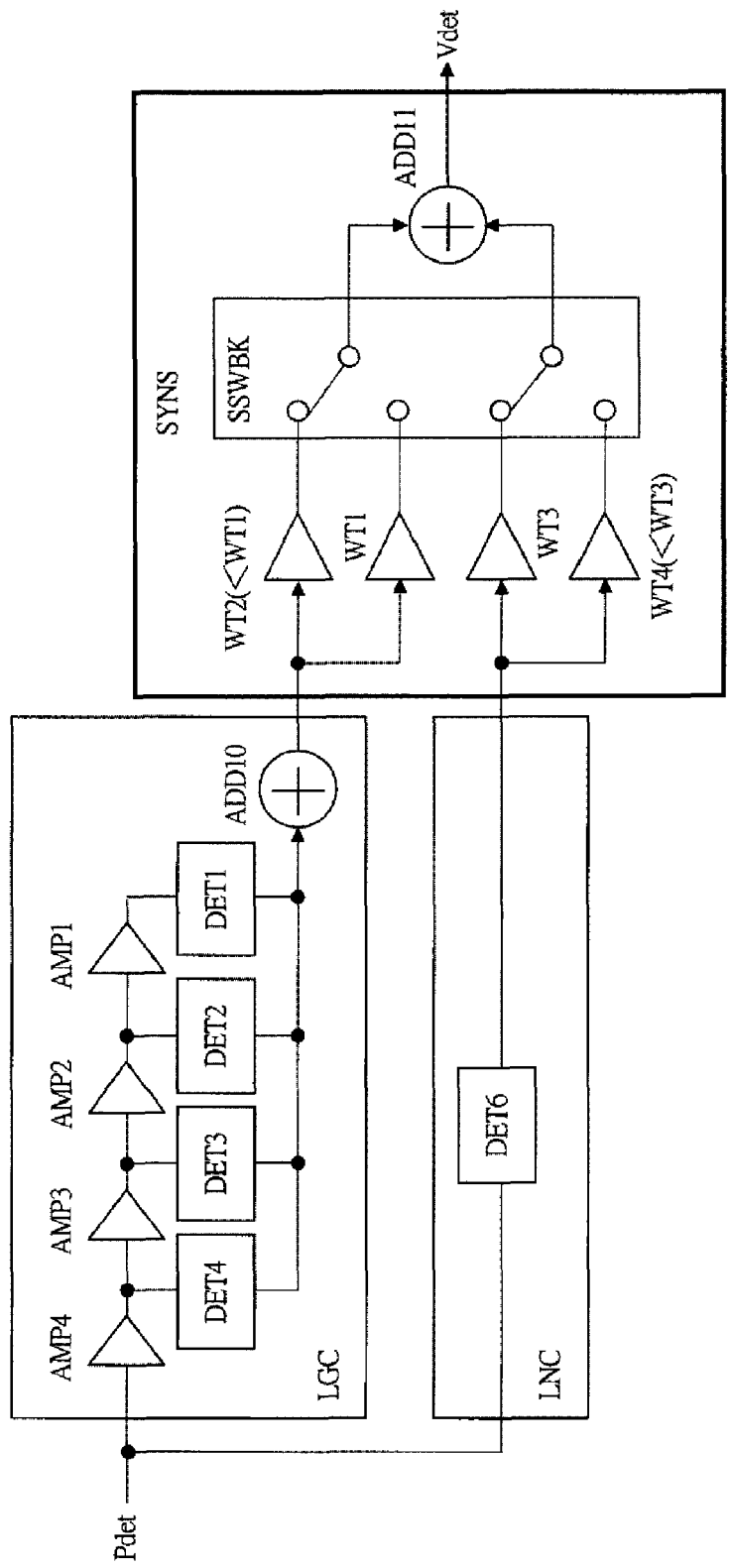
FIG. 8 illustrates an example of the conceptual configuration of a common detection unit in FIG. 7.

FIG. 8 illustrates an example of the conceptual configuration of the common detection unit in FIG. 7. The common detection unit PDETC_CM in FIG. 7 conceptually includes a common log detection circuit LGC, a common linear detection circuit LNC, and a synthesizer circuit SYNS that processes and synthesizes the outputs from the common log detection circuit LGC and the common linear detection circuit LNC. The LGC corresponds to the configuration around the DET1 to the DET4 in FIG. 7 and the LNC corresponds to the configuration around the DET6 in FIG. 7. The SYNS generates an output having a large weight WT1 (corresponding to the MUL2 (for example, $\times 6/5$) in FIG. 7) and an output having a weight WT2 (corresponding to the MUL5 (for example, $\times 1/5$) in FIG. 7) smaller than the weight WT1 on the basis of the output from the LGC. Similarly, the SYNS generates an output having a large weight WT3 (corresponding to the MUL6 (for example, $\times 3$) in FIG. 7) and an output having a weight WT4 (corresponding to a $\times 1$ path from the DET6 to the ADD3 in FIG. 7) smaller than the weight WT3 on the basis of the output from the LNC.

The SYNS appropriately combines the output having the large weight WT1 and the output having the small weight WT2 from the LGC with the output having the large weight WT3 and the output WT4 having the small weight from the LNC with a selective switch block SSWBK for synthesis to realize desired detection characteristics. Specifically, the output having the large weight WT1 from the LGC is added to the output having the small weight WT4 from the LNC with an adder circuit ADD11 (corresponding to the ADD3 in FIG. 7) in the log detection method (the EDGE mode), and the output having the small weight WT2 from the LGC is added to the output having the large weight WT3 from the LNC with the adder circuit ADD11 (corresponding to the ADD6 in FIG. 7) in the log-linear detection method (the GSM mode). Although the SSWBK is arranged downstream of the WT1 to WT4 in FIG. 8 for convenience, the SSWBK may be arranged upstream of the WT1 to WT4 to perform a similar operation.

Although the coefficient of each multiplier circuit in FIG. 7 may be appropriately varied, for example, the following relationship is roughly established in order to realize the log detection and the log-linear detection. With respect to the ×1 path from the DET6 to the ADD3, the MUL2 can have a coefficient relatively close to ×1 from the relationship with the DET6 path in the log detection. In contrast, the MUL5 can have a coefficient smaller than that of the MUL2 (that is, smaller than ×1) in order to suppress the sensitivity at the log side to some extent involved in the log-linear detection. The MUL6 can have a coefficient larger than ×1 in order to increase the sensitivity at the linear side to some extent involved in the log-linear detection.

Figure 9:
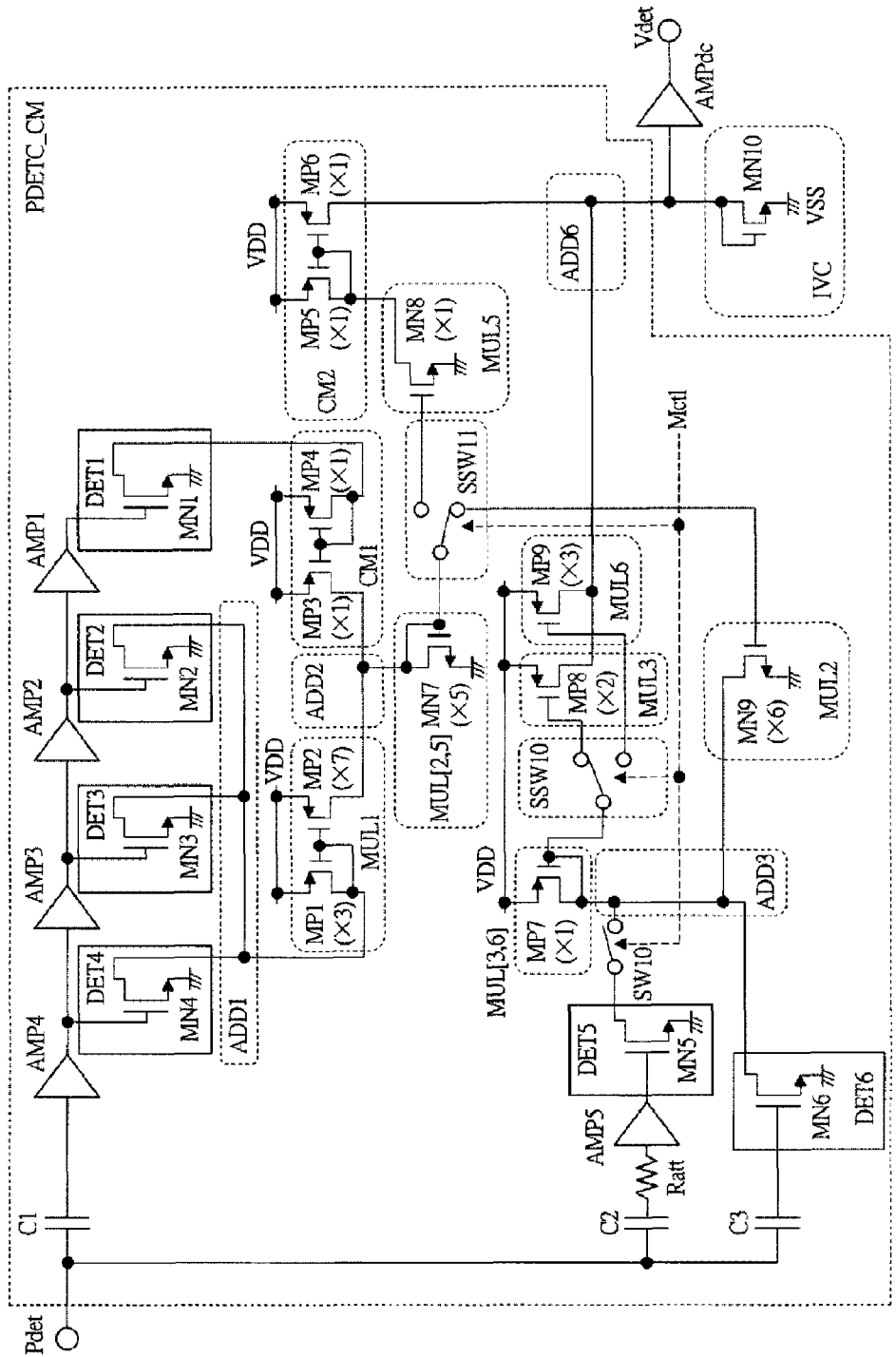
FIG. 9 is a circuit diagram illustrating a detailed exemplary configuration of the power detection circuit block in FIG. 7.

FIG. 9 is a circuit diagram illustrating a detailed exemplary configuration of the power detection circuit block in FIG. 7. Referring to FIG. 9, the level detection circuits DET1 to DET6 are realized by negative channel MOS transistors (NMOS transistors) MN1 to MN6, respectively. For example, when the DET4 is representative of the DET1 to the DET5, the source of the MN4 of the DET4 is connected to ground power supply voltage VSS and the output voltage from the AMP4 is input into the gate of the MN4 of the DET4. When the output voltage from the AMP4 is not sufficient (that is, does not reach a threshold voltage of the MN4 (DET4)), source-drain current Ids does not flow through the MN4 (DET4). In a range in which the output voltage from the AMP4 is between the threshold voltage and the saturated output voltage, the Ids corresponding to the output voltage flows through the MN4 (DET4). When the output voltage from the AMP4 reaches the saturated output voltage, the Ids of the MN4 (DET4) is also fixed to a certain current value (the saturated output current). In the MN6 in the DET6, the Ids starts to flow from a time when the voltage level of the Pdet via the C3 exceeds the threshold voltage of the MN6 and the Ids is sequentially increased in an exponential manner depending on the voltage level of the Pdet.

The multiplier circuit MUL1 preferably includes a current mirror circuit including two positive channel MOS transistors (PMOS transistors) MP1 and MP2. The MP1 and the MP2 have, for example, a transistor size ratio of 3:7. The drains of the three NMOS transistors MN4 (DET4) to the MN2 (DET2) described above are commonly connected to the drain of the MP1. The adder circuit ADD1 is realized by this common connection portion. The Ids of the MN1 (DET1) is transferred by a current mirror circuit CM1 including two PMOS transistors MP4 and MP3 (having a size ratio of, for example, MP4:MP3=1:1). The drain of the MP3 to which the Ids is transferred is commonly connected to the drain of the MP2 in the MUM. The drain of an NMOS transistor MN7 that defines a portion of the multiplier circuits MUL2 and MUL5 and that has diode connection is also connected to this common connection node. The adder circuit ADD2 is realized by this common connection portion.

The gate (drain) of the MN7 (MUL [2,5]) is connected to the gate of an NMOS transistor MN8 defining another portion of the MUL5 and the gate of an NMOS transistor MN9 defining another portion of the MUL2 via the selective switch SSW11. The MN7 (MUL [2,5]) defines a current mirror circuit having a size ratio of, for example, 5:1 with the MN8 (MUL5) and a current mirror circuit having a size ratio of, for example, 5:6 with the MN9 (MUL2) depending on the result of the selection by the SSW11. The configuration in which the gate of the MN8 or the gate of the MN9 is connected to the gate of the MN7 that is diode-connected via the SSW11 allows the MUL2, the MUL5, and the SSW11 to be realized within a small area. The gate of the MN8 or the MN9, which is not selected by the SSW11, is fixed to the VSS via, for example, a switch although not illustrated in FIG. 9.

The drain of the MN5 (DET5) is connected to the drain of a PMOS transistor MP7 that defines a portion of the multiplier circuits MUL3 and MUL6 and that has diode connection via the switch SW10. The drain of the MN6 (DET6) and the drain of the MN9 (MUL2) are also commonly connected to the drain of the MP7 (MUL [3,6]). The adder circuit ADD3 is realized by this common connection portion.

The gate (drain) of the MP7 (MUL [3,6]) is connected to the gate of a PMOS transistor MP8 defining another portion of the MUL3 and the gate of a PMOS transistor MP9 defining another portion of the MUL6 via the selective switch SSW10. The MP7 (MUL [3, 6]) defines a current mirror circuit having a size ratio of, for example, 1:2 with the MP8 (MUL3) and a current mirror circuit having a size ratio of, for example, 1:3 with the MP9 (MUL6) depending on the result of the selection by the SSW10. The configuration in which the gate of the MP8 or the gate of the MP9 is connected to the gate of the MP7 that is diode-connected via the SSW10 allows the MUL3, the MUL6, and the SSW10 to be realized within a small area. The gate of the MP8 or the MP9, which is not selected by the SSW10, is fixed to power supply voltage VDD via, for example, a switch although not illustrated in FIG. 9.

The Ids of the MN8 (MUL5) is transferred by a current mirror circuit CM2 including two PMOS transistors MP5 and MP6 (having a size ratio of, for example, MP5:MP6=1:1). The drain of the MP6 to which the Ids is transferred is commonly connected to the drain of the MP8 (MUL3) and the drain of the MP9 (MUL6). The adder circuit ADD6 is realized by this common connection portion. The drain (gate) of an NMOS transistor MN10 that defines the current-voltage conversion circuit IVC and that has diode connection is also connected to this common connection node. The voltage occurring at the drain of the MN10 (IVC) is amplified by the DC amplifier circuit AMPdc and is output as the detected voltage signal Vdet.

Configuring the level detection circuits DET, the multiplier circuits MUL, and the adder circuits ADD on the basis of the current mirror circuits in the above manner allows the power detection circuit block to be realized within a smaller area, compared with a case in which the adder circuits include operational amplifiers or the likes. In addition, the coefficients of the multiplier circuits MUL1 to MUL3, the MUL5, and the MUL6 can be easily adjusted with the transistor size ratios. In some cases, it is also possible to adjust the transistor size ratios of the current mirror circuits CM1 and CM2. Such adjustment is performed mainly in order to acquire the linearity in the log detection (that is, the EDGE mode) and optimize the loop gain in the log-linear detection (that is, the GSM mode), as described above with reference to FIG. 7. Such adjustment is also performed, for example, in accordance with the difference in the manufacturing process of the semiconductor chip, in accordance with the difference in the frequency band of the detected power signal Pdet, or in response to a request from a user system.

Figure 10:
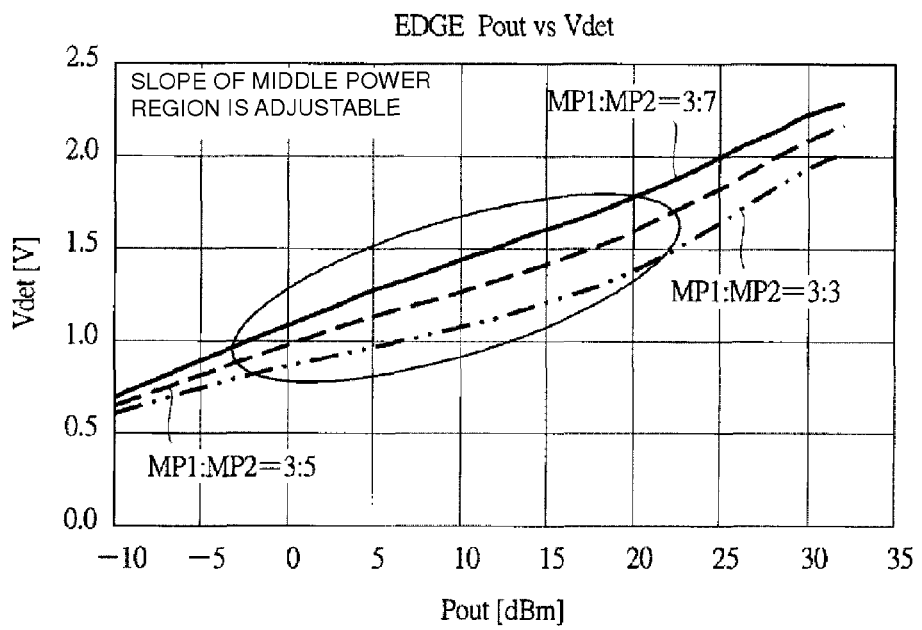
FIG. 10 is an explanatory diagram illustrating an example of how the characteristics are varied with the coefficient of a multiplier circuit in the power detection circuit block in FIG. 9.
Figure 11:
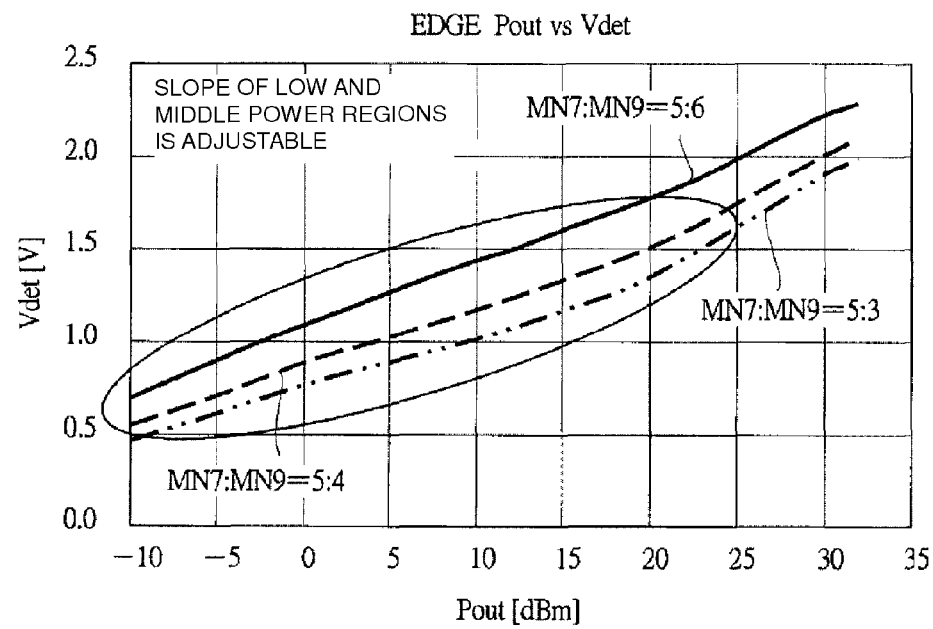
FIG. 11 is an explanatory diagram illustrating an example of how the characteristics are varied with the coefficient of a multiplier circuit in the power detection circuit block in FIG. 9.
Figure 12:
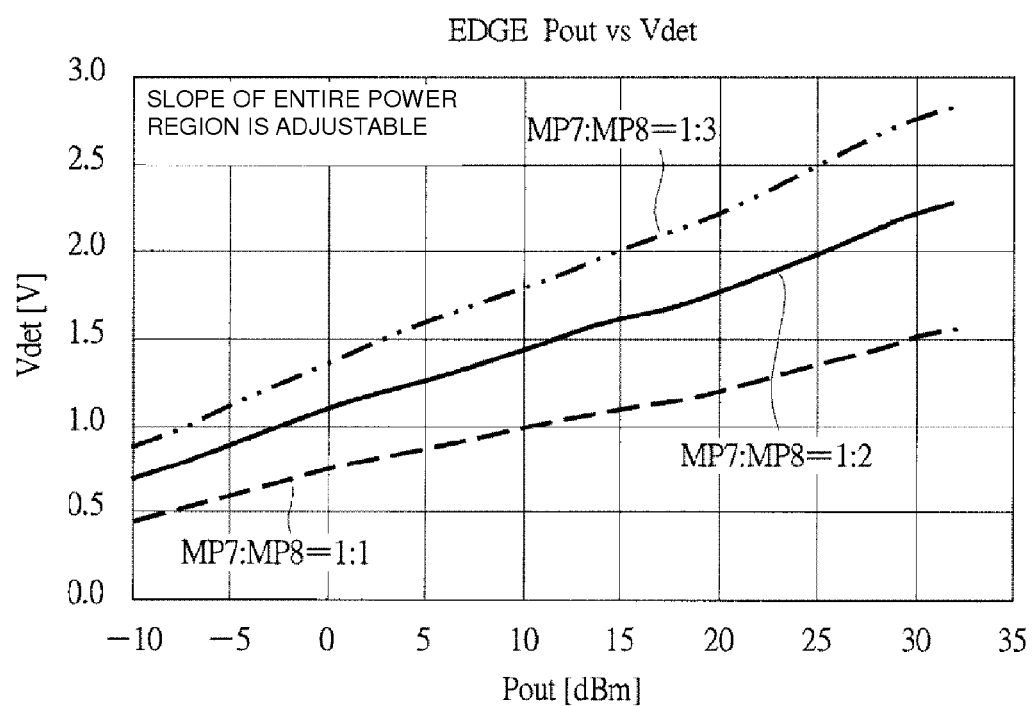
FIG. 12 is an explanatory diagram illustrating an example of how the characteristics are varied with the coefficient of a multiplier circuit in the power detection circuit block in FIG. 9.

FIG. 10 to FIG. 12 are explanatory diagrams illustrating examples of how the characteristics are varied with the coefficients of the multiplier circuits in the power detection circuit block in FIG. 9. The results of simulation of the characteristics of the detected voltage signal Vdet (V) with respect to the output power signal Pout (dBm) (that is, the detected power signal Pdet) are illustrated in FIG. 10 to FIG. 12, taking the EDGE mode (the log detection) as an example. FIG. 10 illustrates an example of how the characteristics are varied when the transistor size ratio (that is, the coefficient of the multiplier circuit MUL1) of the PMOS transistors MP1 and MP2 in FIG. 9 is set to MP1:MP2=3:3, 3:5, and 3:7. In the example in FIG. 10, the Pout (dBm)-Vdet (V) characteristics when MP1:MP2=3:7 is closest to a linear function.

FIG. 11 illustrates an example of how the characteristics are varied when the transistor size ratio (that is, the coefficient of the multiplier circuit MUL2) of the NMOS transistors MN7 and MN9 in FIG. 9 is set to MN7:MN9=5:3, 5:4, and 5:6. In the example in FIG. 11, the Pout (dBm)-Vdet (V) characteristics when MN7:MN9=5:6 is closest to a linear function. FIG. 12 illustrates an example of how the characteristics are varied when the transistor size ratio (that is, the coefficient of the multiplier circuit MUL3) of the PMOS transistors MP7 and MP8 in FIG. 9 is set to MP7:MP8=1:1, 1:2, and 1:3. In the example in FIG. 12, the slope most appropriate for the range of the Vdet is achieved when MP7:MP8=1:3 although the degree of approximation to the linear function is not so varied depending on the transistor size ratio. The adjustment of the slope with respect to the range allows the variation in the Pout to be reduced with respect to the variation in the Vdet.

Figure 13:
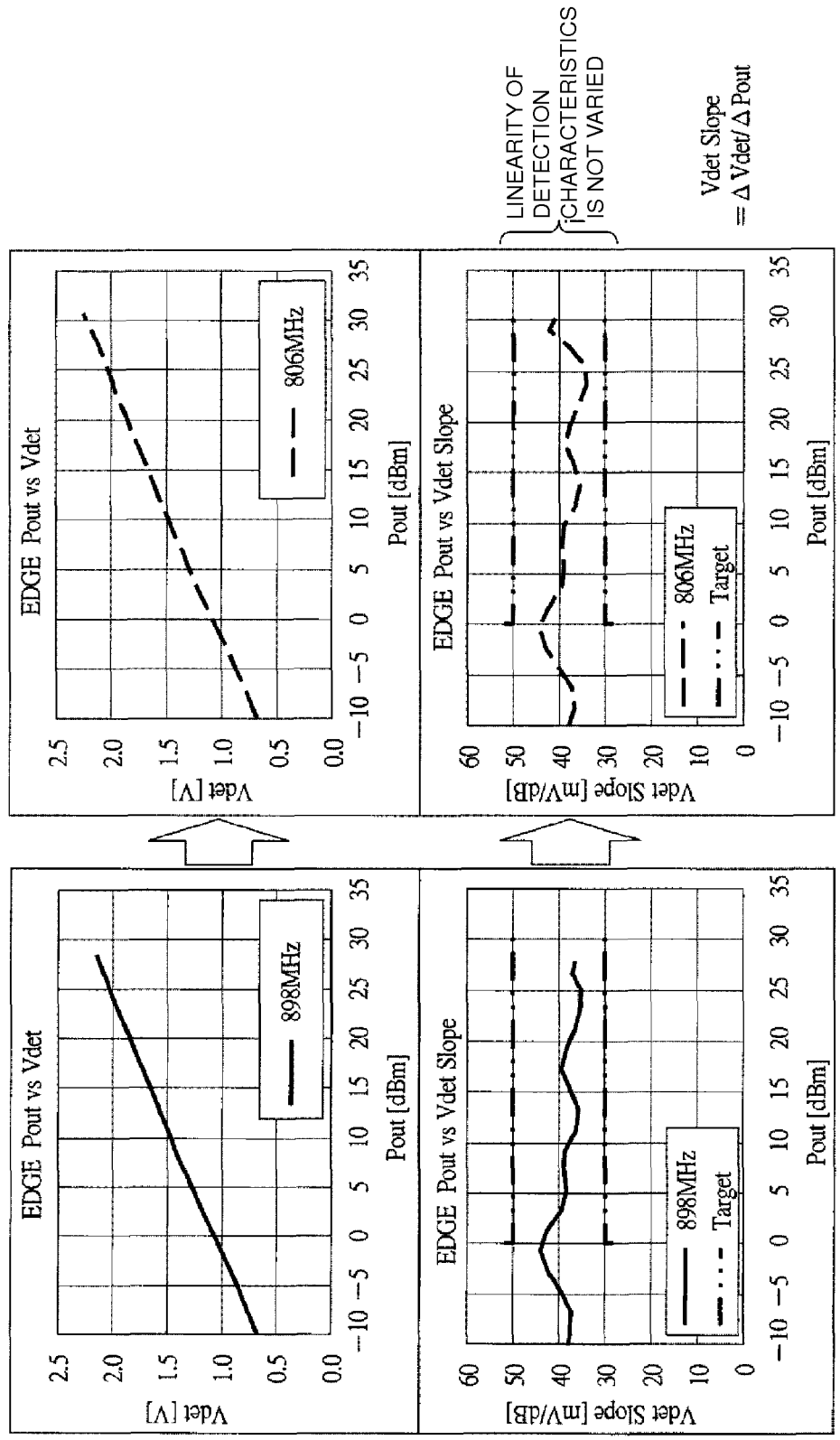
FIG. 13 is an explanatory diagram illustrating an example of how the characteristics are varied with the frequency of a detected power signal, which is an input signal, in the power detection circuit block in FIG. 9.
Figure 14:
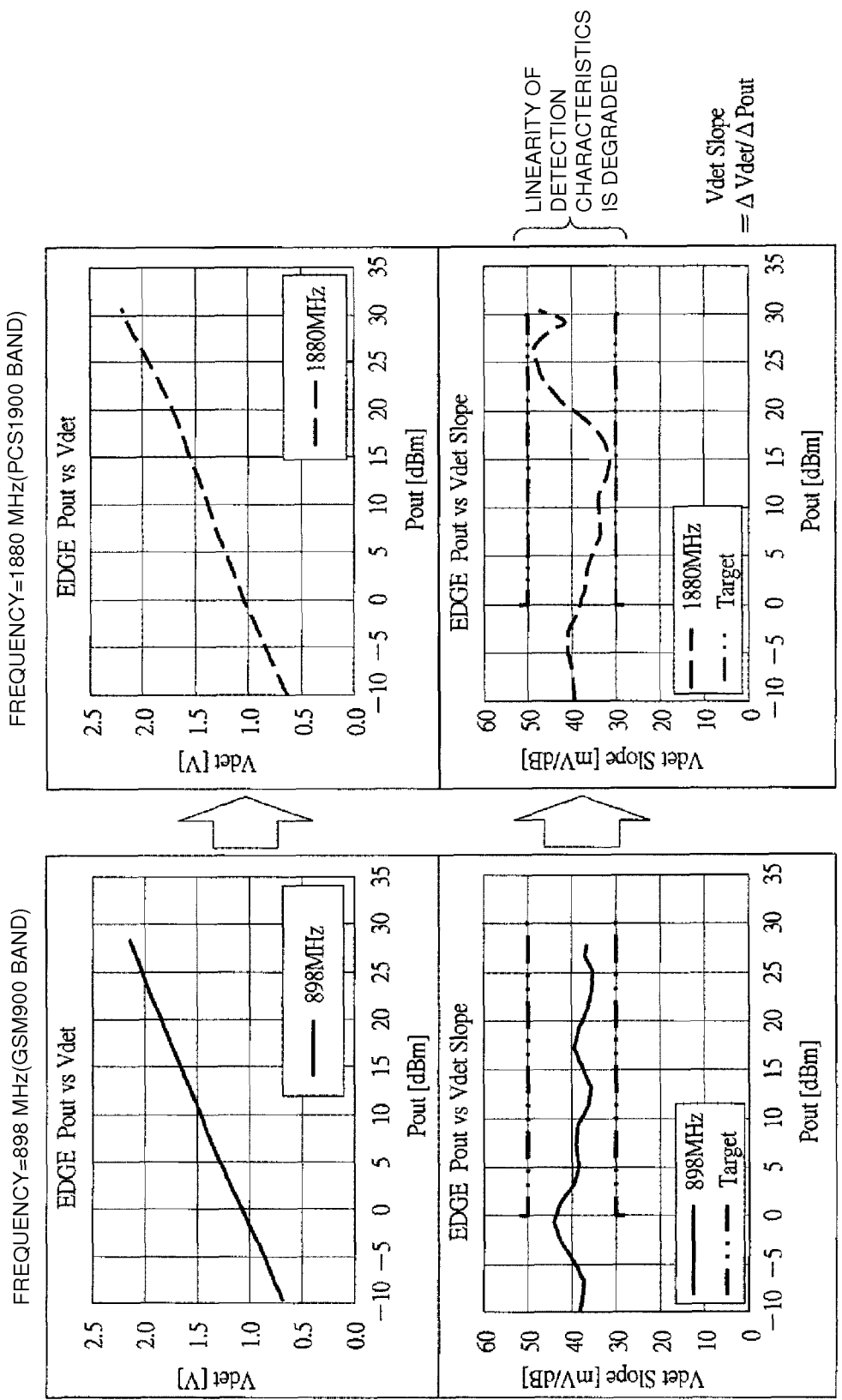
FIG. 14 is an explanatory diagram illustrating an example of how the characteristics are varied with the frequency of the detected power signal, which is the input signal, in the power detection circuit block in FIG. 9.
Figure 15:
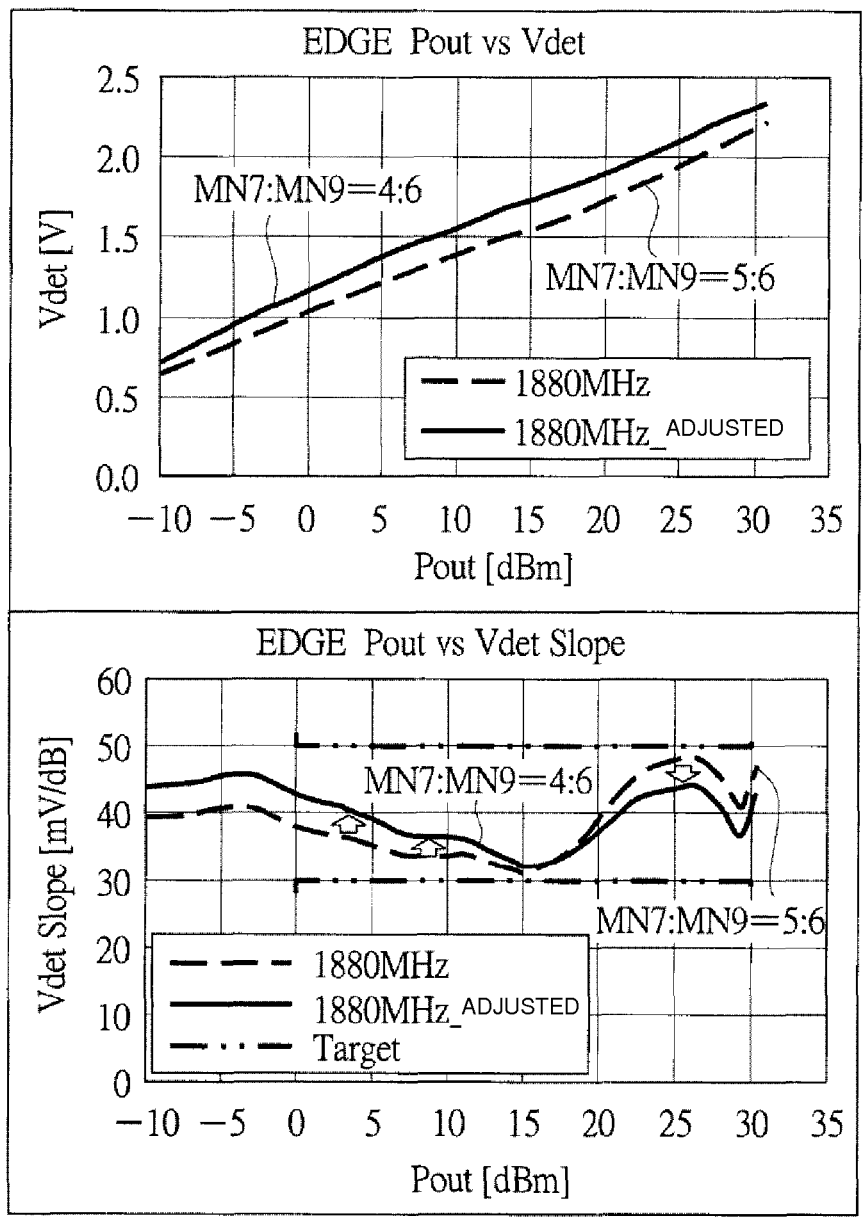
FIG. 15 is an explanatory diagram illustrating an example of how the characteristics are varied when the coefficient of a multiplier circuit in the power detection circuit block in FIG. 9 is varied and is associated with FIG. 14.

FIG. 13 and FIG. 14 are explanatory diagrams illustrating examples of how the characteristics are varied with the frequency of the detected power signal, which is the input signal, in the power detection circuit block in FIG. 9. FIG. 15 is an explanatory diagram illustrating an example of how the characteristics are varied when the coefficient of the multiplier circuit in the power detection circuit block in FIG. 9 is varied. The exemplary diagram in FIG. 15 is associated with FIG. 14. The results of simulation of the characteristics of the detected voltage signal Vdet (V) with respect to the output power signal Pout (dBm) (that is, the detected power signal Pdet) and the characteristics of a Vdet slope (mV/dB) with respect to the Pout (dBm) are illustrated in FIG. 13 to FIG. 15, taking the EDGE mode (the log detection) as an example. The Vdet slope represents the variation (ΔVdet) in the Vdet with respect to the variation (ΔPout) in the Pout. The degree of approximation of the Pout (Pdet)-Vdet characteristics to a linear function is increased with the Vdet slope being constant regardless of the level of the Pout.

FIG. 13 illustrates how the characteristics are varied when the frequency of the Pout (Pdet) is changed from 898 MHz (corresponding to GSM900) to 806 MHz (corresponding to T-GSM810). In this case, the degree of approximation of the Pout (Pdet)-Vdet characteristics to a linear function at the frequency 898 MHz does not differ much from that at the frequency 806 MHz. In contrast, FIG. 14 illustrates how the characteristics are varied when the frequency of the Pout (Pdet) is changed from 898 MHz to 1,880 MHz (corresponding to PCS1900). In this case, the degree of approximation of the Pout (Pdet)-Vdet characteristics to a linear function is reduced mainly in the middle to high power regions.

In the example in FIG. 15, the transistor size ratio of the NMOS transistors MN7 and MN9 (the multiplier circuit MUL2) in the power detection circuit block in FIG. 9 is adjusted. As illustrated in FIG. 15, switching the transistor size ratio of the MN7 and MN9 from MN7:MN9=5:6 to MN7:MN9=4:6 allows the degree of approximation of the Pout (Pdet)-Vdet characteristics to a linear function to be improved. In other words, the adjustment causes the high-band power detection circuit block PDETBK_HB2 and the low-band power detection circuit block PDETBK_LB2 in FIG. 2 to be separately optimized.

The use of the semiconductor integrated circuit apparatus and the radio-frequency power amplifier module of the first preferred embodiment typically allows the multiple detection methods (specifically, the log detection and the log-linear detection) to be realized within a small area. In addition, it is possible to easily optimize the electrical characteristics in each detection method by using the coefficient of each multiplier circuit.

Second Preferred Embodiment

In a second preferred embodiment, a common power detection circuit capable of supporting the W-CDMA (or LTE) mode, in addition to the GSM mode (the log-linear detection) and the EDGE mode (the log detection), will be described.

Figure 16:
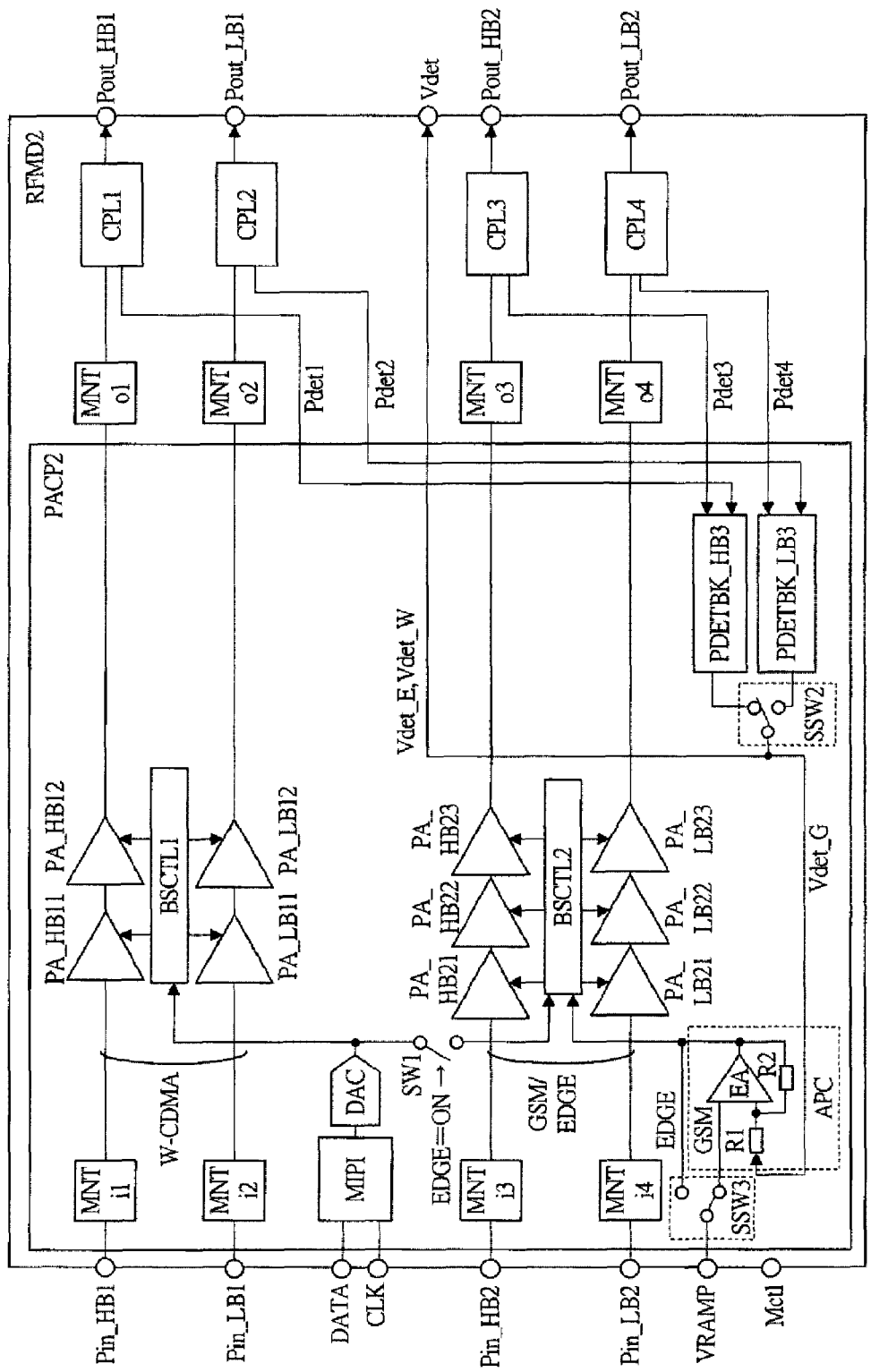
FIG. 16 is a block diagram illustrating an exemplary configuration of a radio-frequency power amplifier module according to a second preferred embodiment of the present invention.

FIG. 16 is a block diagram illustrating an exemplary configuration of a radio-frequency power amplifier module according to the second preferred embodiment of the present invention. Referring to FIG. 16, a radio-frequency power amplifier module RFMD2 differs from the radio-frequency power amplifier module RFMD described above with reference to FIG. 2 in part of an internal circuit of a semiconductor chip (semiconductor integrated circuit apparatus) PACP2. The four power detection circuit blocks corresponding to the four couplers CPL1 to CPL4 are provided in the RFMD in FIG. 2 while the RFMD2 in FIG. 16 includes two power detection circuit blocks PDETBK_HB3 and PDETBK_LB3 corresponding to the CPL1 and the CPL3 (that is, for a high band) and the CPL2 and the CPL4 (that is, for a low band), respectively. Since the remaining configuration is the same as that in FIG. 2, a detailed description of the remaining configuration is omitted herein.

For example, when the radio-frequency power amplifier module RFMD2 operates in the high-band W-CDMA (or LTE) mode, the detected power signal Pdet1 from the CPL1 is input into the PDETBK_HB3. The PDETBK_HB3 generates the detected voltage signal Vdet_W corresponding to the power level of the Pdet1 to output the detected voltage signal Vdet_W outside the semiconductor chip via the selective switch SSW2 used to select the high band or the low band. When the radio-frequency power amplifier module RFMD2 operates in the low-band W-CDMA (or LTE) mode, the detected power signal Pdet2 from the CPL2 is input into the PDETBD_LB3. The PDETBK_LB3 generates the Vdet_W corresponding to the power level of the Pdet2 to output the Vdet_W outside the semiconductor chip via the SSW2.

Similarly, when the radio-frequency power amplifier module RFMD2 operates in the high-band EDGE mode, the detected power signal Pdet3 from the CPL3 is input into the PDETBD_HB3. The PDETBK_HB3 generates the detected voltage signal Vdet_E corresponding to the power level of the Pdet3 to output the detected voltage signal Vdet_E outside the semiconductor chip via the SSW2. When the radio-frequency power amplifier module RFMD2 operates in the low-band EDGE mode, the detected power signal Pdet4 from the CPL4 is input into the PDETBD_LB3. The PDETBK_LB3 generates the Vdet_E corresponding to the power level of the Pdet4 to output the Vdet_E outside the semiconductor chip via the SSW2.

In contrast, when the radio-frequency power amplifier module RFMD2 operates in the high-band GSM mode, the Pdet3 from the CPL3 is input into the PDETBD_HB3. The PDETBK_HB3 generates the detected voltage signal Vdet_G corresponding to the power level of the Pdet3 to supply the detected voltage signal Vdet_G to the automatic power control circuit APC via the SSW2. When the radio-frequency power amplifier module RFMD2 operates in the low-band GSM mode, the Pdet4 from the CPL4 is input into the PDETBD_LB3. The PDETBK_LB3 generates the Vdet_G corresponding to the power level of the Pdet4 to supply the Vdet_G to the APC via the SSW2. As described above with reference to FIG. 2, the feedback control via the APC is performed to control the power level of the output power signal Pout_HB2 or Pout_LB2.

Figure 17:
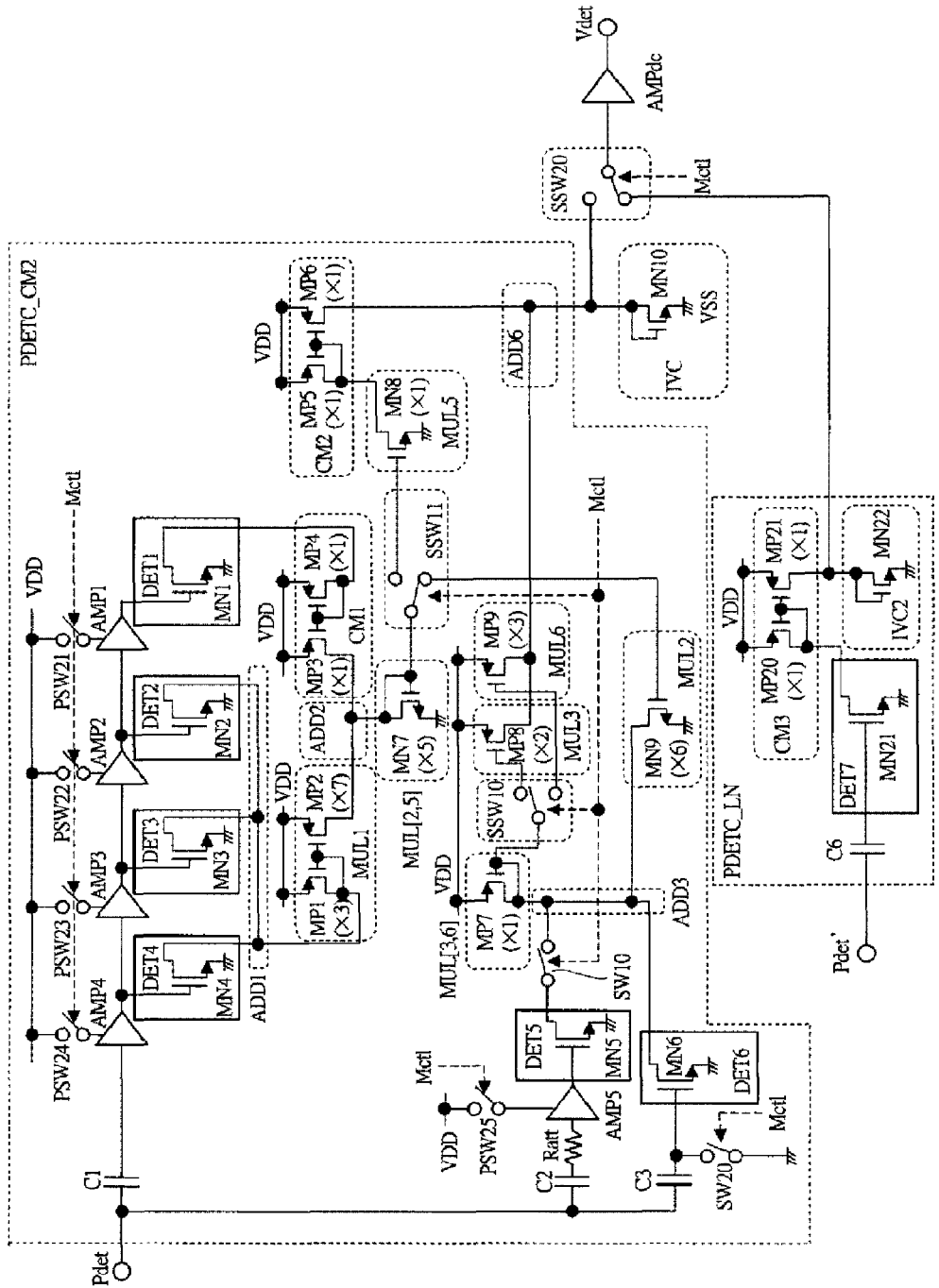
FIG. 17 is a circuit diagram illustrating a detailed exemplary configuration of a power detection circuit block in the radio-frequency power amplifier module in FIG. 16.

FIG. 17 is a circuit diagram illustrating a detailed exemplary configuration of the power detection circuit block in the radio-frequency power amplifier module in FIG. 16. The power detection circuit block illustrated in FIG. 17 corresponds to the PDETBK_LB3 (or PDETBK_HB3) in FIG. 16. The power detection circuit block differs from the exemplary configuration in FIG. 9 described above in that the PDETC_CM in FIG. 9 is replaced with a common detection unit PDETC_CM2 in FIG. 17 and a linear detection unit PDETC_LN and a selective switch SSW20 are added. The PDETC_CM2 in FIG. 17 differs from the PDETC_CM in FIG. 9 in that power switches PSW21 to PSW25 are added to the amplifier circuits AMP1 to AMP5 and a switch SW20 is added between the input of the level detection circuit DET6 and the ground power supply voltage VSS. Since the remaining configuration is the same as that in FIG. 9, a detailed description of the remaining configuration is omitted herein.

The linear detection unit PDETC_LN includes an alternating-current coupling capacitor C6, a level detection circuit DET7, a current mirror circuit CM3, and a current-voltage conversion circuit IVC2. The DET7 preferably includes an NMOS transistor MN21 the source of which is grounded. A detected power signal Pdet' is input into the gate of the MN21 through the C6. The CM3 preferably includes PMOS transistors MP20 and MP21 having a transistor size ratio of, for example, 1:1. The MP20 receives the source-drain current Ids of the MN21 and transfers the source-drain current Ids to the MP21. The IVC2 preferably includes an NMOS transistor MN22 that is diode-connected. The IVC2 receives the Ids of the MP21 to convert the Ids into voltage. The selective switch SSW20 selects the output voltage from the current-voltage conversion circuit IVC, corresponding to the PDETC_CM2 described above, or the output voltage from the IVC2 in the PDETC_LN to supply the selected output voltage to the DC amplifier circuit AMPdc.

In the above exemplary configuration, in the GSM mode and the EDGE mode, the PDETC_CM2 receives the detected power signal Pdet (corresponding to the Pdet3 or the Pdet4 in FIG. 16) to operate in a manner similar to the one of the PDETC_CM in FIG. 9 described above. In this case, in response to the mode setting signal Mct, the power switches PSW21 to PSW25 are turned on and the switch SW20 is switched off. The output current from the PDETC_CM2 is converted into voltage by the IVC and the voltage is output through the SSW20 and the APMdc as the detected voltage signal Vdet. The selection by the SSW20 is also controlled on the basis of the Mct1.

In contrast, in the W-CDMA (or LTE) mode, the PDETC_LN operates in response to the detected power signal Pdet' (corresponding to the Pdet1 or the Pdet2 in FIG. 16). In the PCETC_CM2, the power switches PSW21 to PSW25 are turned off and the switch SW20 is switched on. In the PDETC_LN, the MN21 (DET7) generates current corresponding to the level of the Pdet' and the IVC2 converts the current into voltage. The voltage is output through the SSW20 and the AMPdc as the Vdet.

As described above, the use of the linear detection method described above with reference to FIG. 3A is one main feature in the W-CDMA (or LTE) mode in the second preferred embodiment. The low power consumption is further required in the W-CDMA (or LTE) standard, compared with the GSM standard and the EDGE standard. In addition, since the detected voltage signal Vdet is externally output from the chip in the W-CDMA mode, as in the EDGE mode, as described above, the linear function relationship is desirably established between Pdet' and Vdet. In order to achieve both the low power consumption and the linear function relationship, the linear detection method is used, in which the linear function characteristics are achieved when the linear scale is applied to both the Pdet' and Vdet. Since the PDETC_LN, which is a circuit having a small area (that is, which is an power saving circuit), is operated to set the PDETC_CM2 in a power shutdown state in the linear detection method, as illustrated in FIG. 17, the lower power consumption is achieved. Since the control range of the output power in the W-CDMA (or LTE) mode is normally narrower than that in the EDGE mode, it is sufficient to use the linear detection method, instead of the log detection method.

Figure 18:
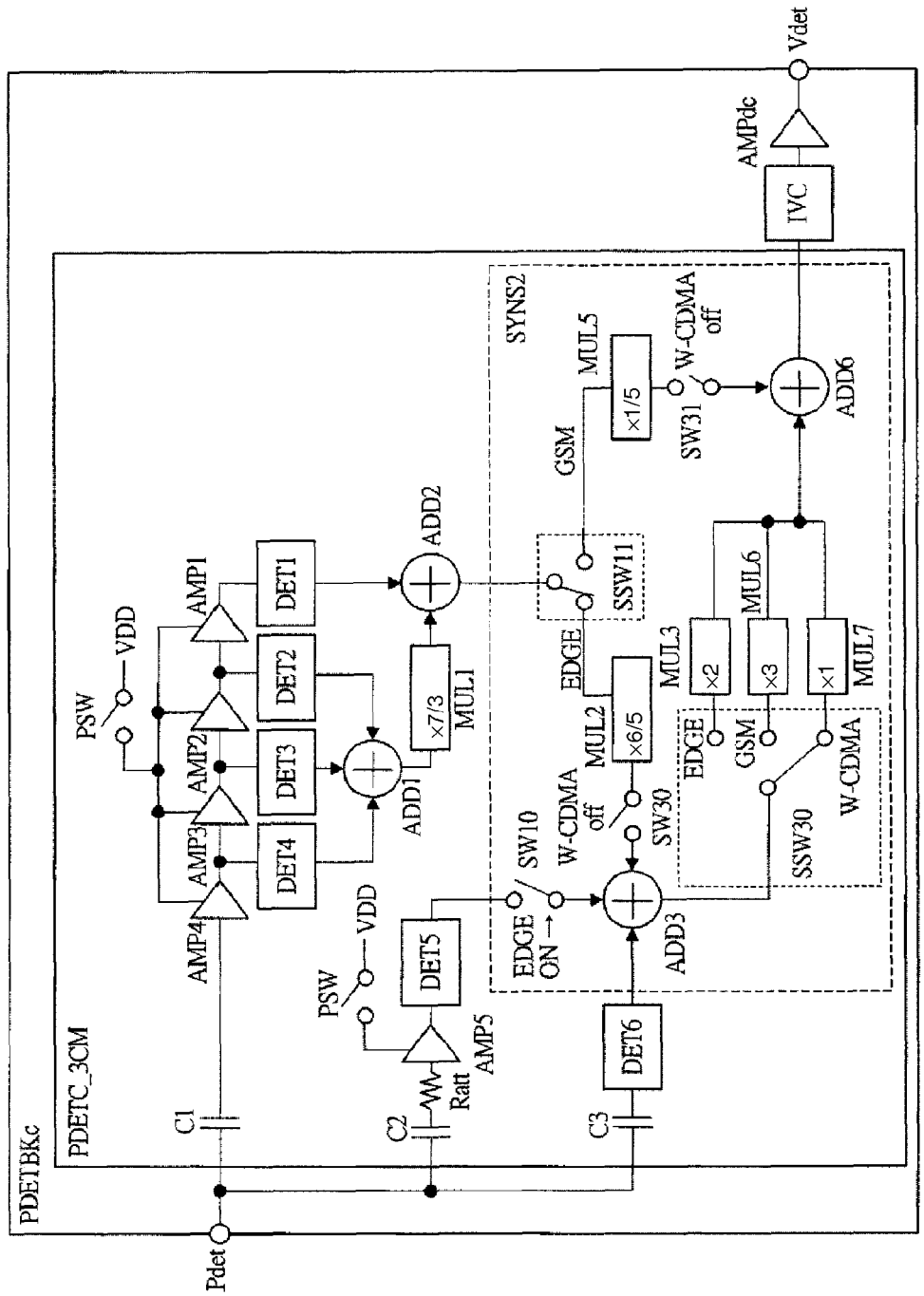
FIG. 18 is a circuit block diagram illustrating another exemplary configuration of the power detection circuit block in the radio-frequency power amplifier module in FIG. 16.

FIG. 18 is a circuit block diagram illustrating another exemplary configuration of the power detection circuit block in the radio-frequency power amplifier module in FIG. 16. As described above, although the use of the exemplary configuration in FIG. 17 enables the log detection, the log-linear detection, and the linear detection, separately providing the linear detection unit PDETC_LN may possibly increase the circuit area. Accordingly, it is useful to use the exemplary configuration in FIG. 18. A power detection circuit block PDETBKc illustrated in FIG. 18 corresponds to the PDETBK_LB3 (or the PDETBK_HB3) in FIG. 16. The power detection circuit block PDETBKc includes a common detection unit PDETC_CM3, the current-voltage conversion circuit IVC, and the DC amplifier circuit AMPdc. The IVC converts the output current from the PDETC_CM3 into voltage to output the voltage via the AMPdc. This output voltage is the detected voltage signal Vdet.

The common detection unit PDETC_CM3 has a configuration in which a power switch PSW is added to the amplifier circuits AMP1 to AMP5, switches SW30 and SW31 and a multiplier circuit MUL7 are added, and the SSW10 in FIG. 7 is replaced with a selective switch SSW30 in FIG. 18, compared with the common detection unit PDETC_CM in FIG. 7. Since the remaining configuration is the same as that in FIG. 7, a detailed description of the remaining configuration is omitted herein. The SW30 is provided between the multiplier circuit MUL2 and the adder circuit ADD3 and the SW31 is provided between the multiplier circuit MUL5 and the adder circuit ADD6. The MUL7 is provided in parallel or substantially in parallel to the multiplier circuits MUL3 and MUL6 described above and has a coefficient of, for example, ×1. The SSW30 is used to connect the output from the adder circuit ADD3 to one of the MUL3, the MUL6, and the MUL7. The operations of the PSW, the SW30, the SW31, and the SSW30 are based on the mode setting signal Mct1. The detected power signal Pdet corresponds to any of the Pdet1 to the Pdet4 in FIG. 16.

In the above exemplary configuration, for example, in the GSM mode or the EDGE mode, the power switch PSW is switched on, the SW30 and the SW31 are switched on, and the SSW30 selects either of the MUL3 and the MUL6. In this case, the exemplary configuration in FIG. 18 is equivalent to the exemplary configuration in FIG. 7 and an operation similar to the one in FIG. 7 is performed. In the W-CDMA (or LTE) mode, the PSW is switched off, the SW30 and the SW31 are switched off, and the SSW30 selects the MUL7. In this case, the log detection portion around the AMP1 to the AMP5 is in the power shutdown state, the level of the Pdet is detected by the level detection circuit DET6, and the output current from the level detection circuit DET6 is supplied to the IVC through the ADD3, the SSW30, the MUL7, and the ADD6.

With the above configuration, as in the example in FIG. 17, it is possible to approximate the Pdet-Vdet relationship with a linear function, to achieve the low power consumption, and to reduce the area of the entire power detection circuit block, compared with the case in FIG. 17, in the W-CDMA (or LTE) mode. Both the SW30 and the SW31 may not necessarily be provided and either of them may be provided. For example, when only the SW30 is provided, the SSW11 is connected to the MUL2 side and the SW30 is turned on in the EDGE mode and the SSW11 is connected to the MUL2 side and the SW30 is turned off in the W-CDMA (or LTE) mode. In contrast, when only the SW31 is provided, the SSW11 is connected to the MUL5 side and the SW31 is turned on in the GSM mode and the SSW11 is connected to the MUL5 side and the SW31 is turned off in the W-CDMA (or LTE) mode. Instead of the SW30 and the SW31, one switch may be provided between the ADD2 and the SSW11. In other words, it is sufficient to provide a control circuit causing the output from the ADD2 not to be reflected to the ADD3 and the ADD6 in the W-CDMA (or LTE) mode.

Figure 19:
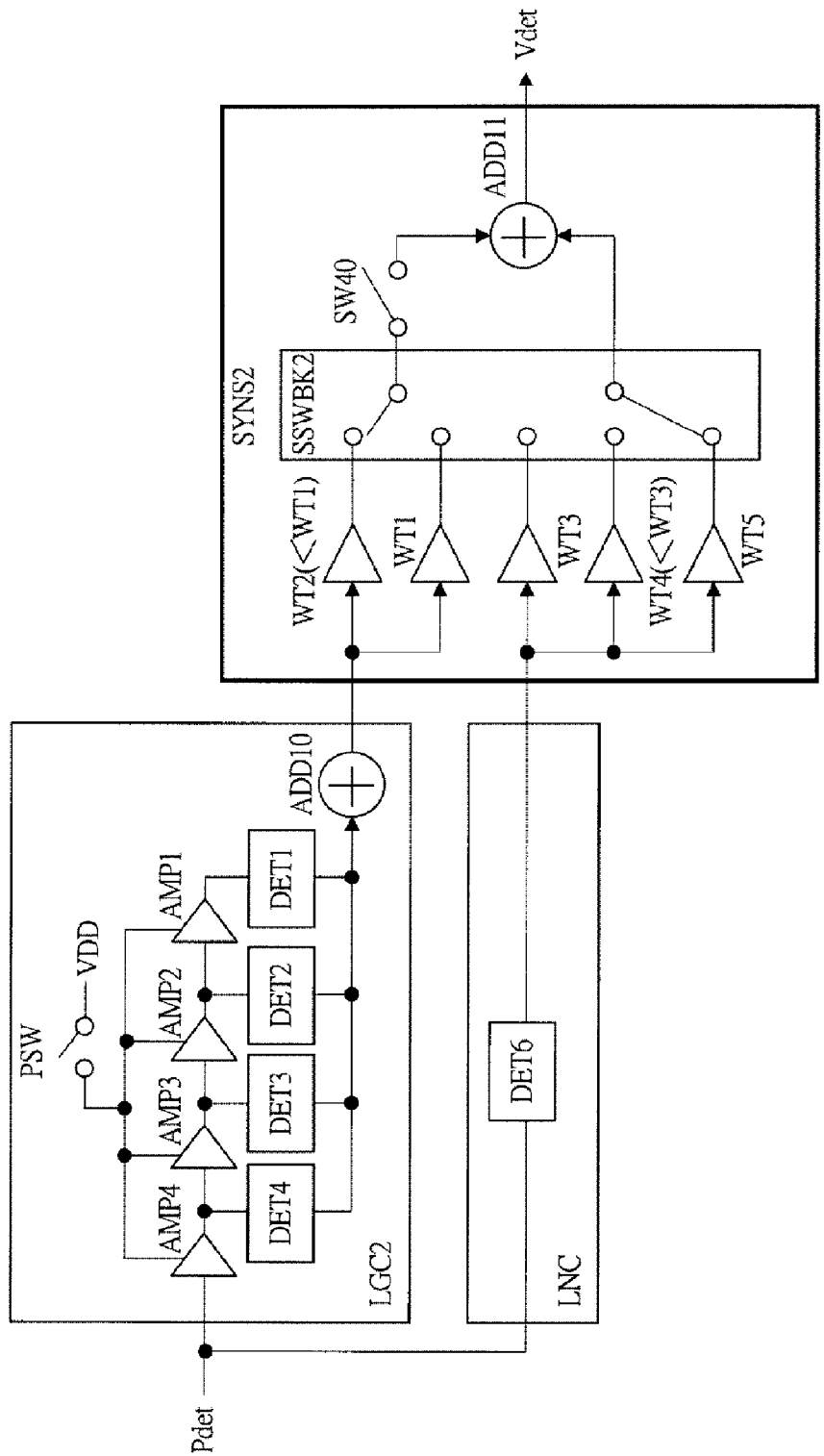
FIG. 19 illustrates an example of the conceptual configuration of a common detection unit in FIG. 18.

FIG. 19 illustrates an example of the conceptual configuration of the common detection unit in FIG. 18. The common detection unit PDETC_CM3 in FIG. 18 conceptually includes a common log detection circuit LGC2, the common linear detection circuit LNC, and a synthesizer circuit SYNS2 that processes and synthesizes the outputs from the common log detection circuit LGC2 and the common linear detection circuit LNC. The LGC2 corresponds to the configuration around the DET1 to DET4 in FIG. 18 and the LNC corresponds to the configuration around the DET6 in FIG. 18. In the example of the configuration in FIG. 19, compared with the exemplary configuration in FIG. 8, the power switch PSW is added to the amplifier circuits AMP1 to AMP4 in the LGC2 and the configuration in the SYNS2 is slightly varied from the configuration in the SYNS in FIG. 8.

The SYNS2 has a configuration in which a weight WT5 is added in parallel to the weights WT3 and WT4, the WT5 is added as a choice of a selective switch SSWBK2 involved in the addition of the weight WT5, and a switch SW40 is added between the outputs from the WT1 and WT2 and the input of the adder circuit ADD11, compared with the SYNS in FIG. 8. Referring to FIG. 19, in the log-linear detection (the GSM mode) or the log detection (the EDGE mode), an operation similar to the operation in FIG. 8 is performed with the PSW turned on and the SW40 switched on. In contrast, in the linear detection (W-CDMA (or LTE) mode), the SYNS2 generates an output having the weight WT5 (corresponding to the MUL7 in FIG. 18) on the basis of the output from the LNC with the PSW turned off and the SW40 (corresponding to the SW30 and the SW31 in FIG. 18) switched off and outputs the output via the ADD11 (corresponding to the ADD6 in FIG. 18).

Figure 20:
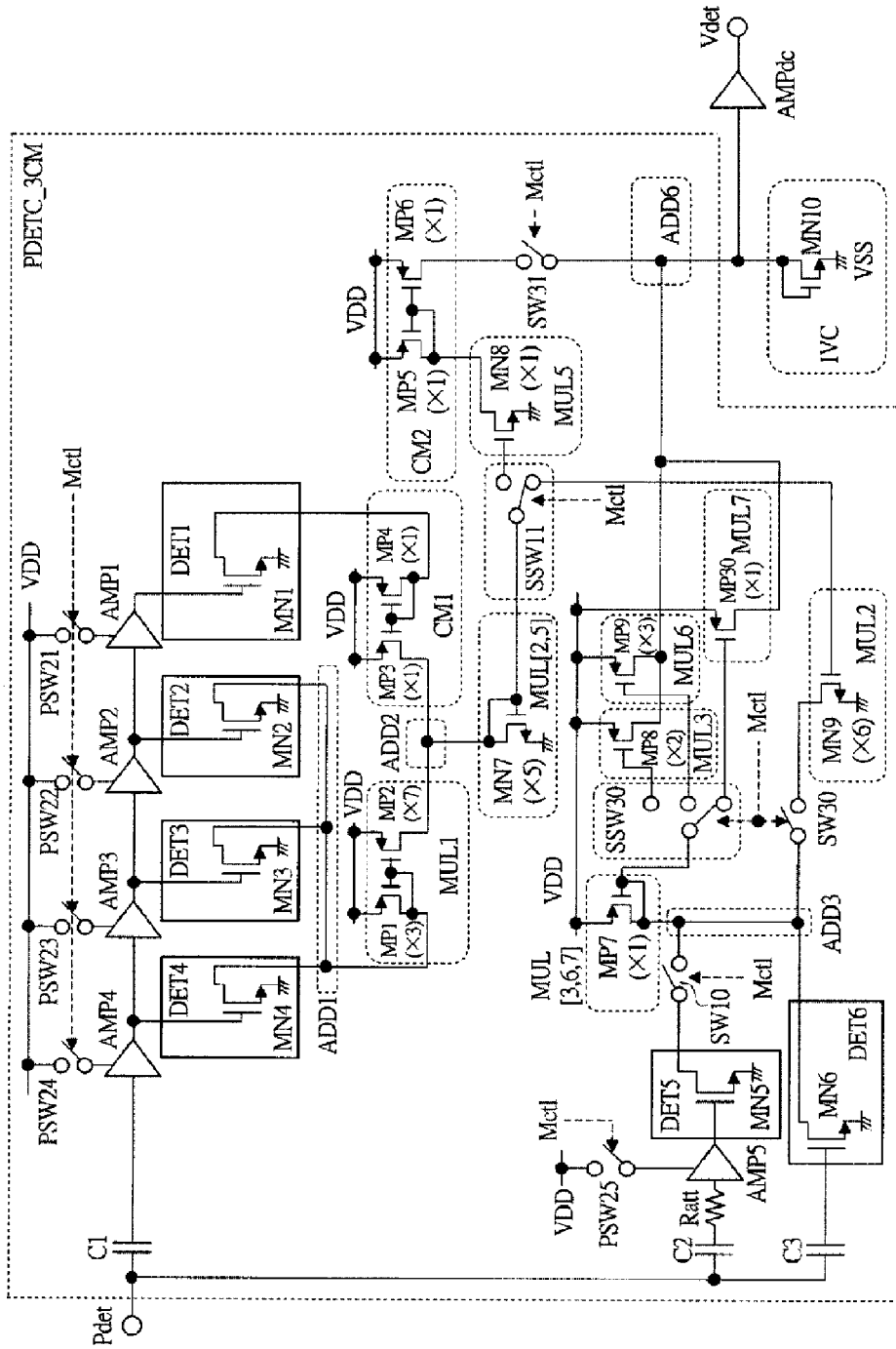
FIG. 20 is a circuit diagram illustrating a detailed exemplary configuration of the power detection circuit block in FIG. 18.

FIG. 20 is a circuit diagram illustrating a detailed exemplary configuration of the power detection circuit block in FIG. 18. The exemplary configuration in FIG. 20 differs from the exemplary configuration in FIG. 9 described above in that power switches PSW21 to PSW25 are added to the amplifier circuits AMP1 to AMP5, respectively; the SW30, the SW31, and the MUL7 are added; and the SSW10 in FIG. 9 is replaced with the SSW30 in FIG. 20. The SW30 is connected between the drain of the NMOS transistor MN9 defining the multiplier circuit MUL2 and the adder circuit ADD3, and the switch SW31 is connected between the drain of the PMOS transistor MP6 defining the current mirror circuit CM2 and the adder circuit ADD6. However, either of the SW30 and the SW31 may be removed, for example, in a configuration in which the gate of the transistor (the MN8 or the MN9) that is not selected with the selective switch SSW11 is connected to the ground power supply voltage VSS.

The multiplier circuit MUL7 preferably includes the PMOS transistor MP7 defining a portion of the multiplier circuits MUL3, MUL6, and MUL7 and a PMOS transistor MP30 defining a current mirror circuit having a transistor size ratio of 1:1 with the PMOS transistor MP7. The drain of the MP30 is commonly connected to the drains of the PMOS transistors MP8 and MP9 defining another portion of the MUL3 and the MUL6. The selective switch SSW30 is used to selectively connect the gate of the MP7 to one of the gates of the MP8, the MP9, and the MP30. Such a configuration of the multiplier circuits and the selective switch achieves a reduction in the area, as described above with reference to FIG. 9.

The use of the semiconductor integrated circuit apparatus and the radio-frequency power amplifier module of the second preferred embodiment typically allows the multiple detection methods (specifically, the log detection, the log-linear detection, and the linear detection) to be realized within a small area. In addition, it is possible to easily optimize the electrical characteristics in each detection method by using the coefficient of each multiplier circuit, as in the first preferred embodiment. Although the coefficient of the multiplier circuit MUL7 is set to ×1, the coefficient of the multiplier circuit MUL7 may be appropriately varied.

While the present invention is specifically described on the basis of various preferred embodiments, the present invention is not limited to the above preferred embodiments and many changes and modifications are possible without departing from the true spirit and scope of the present invention.

The semiconductor integrated circuit apparatuses and the radio-frequency power amplifier modules according to the preferred embodiments of the present invention are, in particular, usefully applied to multi-mode and multi-band cellular phones and are widely applicable to radio communication systems requiring the detection of transmission power, in addition to the multi-mode and multi-band cellular phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor integrated circuit apparatus comprising:
   N-number first amplifier circuits that receive a first power signal, that are cascade-connected in order from a first stage circuit to an N-th stage circuit, and that have a first gain;
   N-number first level detection circuits that are provided for the N-number first amplifier circuits and that output currents in accordance with output levels of the first stage circuit to the N-th stage circuit of the N-number first amplifier circuits;

a first adder circuit that adds the output currents from the N-number first level detection circuits to each other to output a first current resulting from addition performed by the first adder circuit;

a second level detection circuit that receives the first power signal and outputs a second current in accordance with a level of the first power signal;

a synthesizer circuit that generates a third current resulting from multiplication of the first current by a first value and a fourth current resulting from multiplication of the first current by a second value lower than the first value and generates a fifth current resulting from multiplication of the second current by a third value and a sixth current resulting from multiplication of the second current by a fourth value lower than the third value to output current resulting from addition of either of the third current and the fourth current to either of the fifth current and the sixth current; and a current-voltage conversion circuit that converts the output current from the synthesizer circuit into voltage.

2. The semiconductor integrated circuit apparatus according to claim 1, wherein the synthesizer circuit operates in one of a first mode in which the third current is added to the sixth current and a second mode in which the fourth current is added to the fifth current.

3. The semiconductor integrated circuit apparatus according to claim 2, wherein the N-number first level detection circuits include N-number first transistors including gates that receive output voltages from the first stage circuit to the N-th stage circuit of the N-number first amplifier circuits and sources that are grounded;

the second level detection circuit includes a second transistor including a gate that receives the first power signal and a source that is grounded;

the first adder circuit adds source-drain currents of the N-number first transistors to each other to output the first current; and the synthesizer circuit includes a plurality of current mirror circuits that receive the first current and source-drain current of the second transistor to generate the third, fourth, fifth and sixth currents depending on a transistor size ratio.

4. The semiconductor integrated circuit apparatus according to claim 3, wherein the third value is higher than the second value.

5. The semiconductor integrated circuit apparatus according to claim 2, wherein the first power signal is varied with an EDGE-mode transmission power signal in the first mode and is varied with a GSM-mode transmission power signal in the second mode.

6. The semiconductor integrated circuit apparatus according to claim 2, further comprising:

a power switch that controls presence of supply of power to the N-number first amplifier circuits;

the synthesizer circuit generates a seventh current resulting from multiplication of the second current by a fifth value, has a third mode in which the seventh current is supplied to the current-voltage conversion circuit, and operates in any of the first mode, the second mode, and the third mode; and the power switch is switched off when the synthesizer circuit operates in the third mode.

7. The semiconductor integrated circuit apparatus according to claim 6, wherein the first power signal is varied with an EDGE-mode transmission power signal in the first mode, is varied with a GSM-mode transmission power signal in the second mode, and is varied with a W-CDMA-mode or LTE-mode transmission power signal in the third mode.

8. A cellular phone comprising semiconductor integrated circuit apparatus according to claim 1.

9. A semiconductor integrated circuit apparatus comprising:

N-number first amplifier circuits that receive a first power signal, that are cascade-connected in order from a first stage circuit to an N-th stage circuit, and that have a first gain;

a second amplifier circuit that has the first gain and that is connected downstream of the N-number first amplifier circuits;

N-number first level detection circuits that are provided for the N-number first amplifier circuits and that output currents in accordance with output levels of the first stage circuit to the N-th stage circuit of the N-number first amplifier circuits;

a second level detection circuit that outputs current in accordance with an output level of the second amplifier circuit;

a first adder circuit that adds the output currents from the N-number first level detection circuits to each other;

a first multiplier circuit that multiplies output current from the first adder circuit by a first coefficient;

a second adder circuit that adds output current from the first multiplier circuit to the output current from the second level detection circuit to output a first current resulting from addition performed by the second adder circuit;

a third level detection circuit that receives the first power signal to output a second current in accordance with a level of the first power signal;

a second multiplier circuit that outputs current resulting from multiplication of the first current by a second coefficient in a first mode;

a third multiplier circuit that outputs current resulting from multiplication of the first current by a third coefficient in a second mode;

a first control circuit that controls the output from the third multiplier circuit so as to be in an invalid state in the first mode and controls the output from the second multiplier circuit so as to be in the invalid state in the second mode;

a third adder circuit that adds the output current from the second multiplier circuit to the second current;

a fourth multiplier circuit that outputs current resulting from multiplication of output current from the third adder circuit by a fourth coefficient in the first mode;

a fifth multiplier circuit that outputs current resulting from multiplication of the output current from the third adder circuit by a fifth coefficient in the second mode;

a second control circuit that controls the output from the fifth multiplier circuit so as to be in the invalid state in the first mode and controls the output from the fourth multiplier circuit so as to be in the invalid state in the second mode;

a fourth adder circuit that adds the output currents from the fourth multiplier circuit and the fifth multiplier circuit to the output current from the third multiplier circuit; and a current-voltage conversion circuit that converts output current from the fourth adder circuit into voltage; wherein the third coefficient is smaller than the second coefficient and is smaller than ×1; and the fifth coefficient is larger than ×1.

10. The semiconductor integrated circuit apparatus according to claim 9, further comprising:
- an attenuator circuit that receives the first power signal and that attenuates the first power signal;
- a third amplifier circuit that has the first gain and that receives an output from the attenuator circuit;
- a fourth level detection circuit that outputs current in accordance with an output level of the third amplifier circuit; and
- a third control circuit that supplies the output current from the fourth level detection circuit to the third adder circuit in the first mode and that controls the output from the fourth level detection circuit so as to be in the invalid state in the second mode; wherein
- the third adder circuit adds the output current from the second multiplier circuit, the second current, and the output current from the fourth level detection circuit to each other in the first mode.

11. The semiconductor integrated circuit apparatus according to claim 10, wherein
- the N-number first level detection circuits include N-number first transistors including gates that receive output voltages from the first stage circuit to the N-th stage circuit of the N-number first amplifier circuits and sources that are grounded;
- the second level detection circuit includes a second transistor including a gate that receives output voltage from the second amplifier circuit and a source that is grounded;
- the third level detection circuit includes a third transistor including a gate that receives the first power signal and a source that is grounded;
- the fourth level detection circuit includes a fourth transistor including a gate that receives an output voltage from the third amplifier circuit and a source that is grounded; and
- the first, second, third, fourth and fifth multiplier circuits include first, second, third, fourth and fifth current mirror circuits having transistor size ratios corresponding to the first, second, third, fourth and fifth coefficients, respectively.

12. The semiconductor integrated circuit apparatus according to claim 11, wherein the second and third current mirror circuits include:
- a fifth transistor that receives the first current between a source and a drain thereof and that have a diode connection; and
- sixth and seventh transistors to which a source-drain current of the fifth transistor is transferred; wherein
- the first control circuit connects either of a gate of the sixth transistor and a gate of the seventh transistor to a gate of the fifth transistor depending on the first and second modes;
- the fourth and fifth current mirror circuits include:
  - an eighth transistor that receives output current from the third adder circuit between a source and a drain thereof and that has a diode connection; and
  - ninth and tenth transistors to which a source-drain current of the eighth transistor is transferred; and
- the second control circuit connects either of a gate of the ninth transistor and a gate of the tenth transistor to a gate of the eighth transistor depending on the first and second modes.

13. The semiconductor integrated circuit apparatus according to claim 10, wherein the first power signal is varied with an EDGE-mode transmission power signal in the first mode and is varied with a GSM-mode transmission power signal in the second mode.

14. The semiconductor integrated circuit apparatus according to claim 9, further comprising:
- a power switch that supplies power to the N-number first amplifier circuits in the first and second modes and shuts off supply of the power to the N-number first amplifier circuits in a third mode; and
- a sixth multiplier circuit that outputs current resulting from multiplication of the output current from the third adder circuit by a sixth coefficient in the third mode; wherein
- the first control circuit controls the outputs from the second and third multiplier circuits so as to be in the invalid state in the third mode; and
- the second control circuit controls the outputs from the fourth and fifth multiplier circuits so as to be in the invalid state in the third mode and controls the output from the sixth multiplier circuit so as to be in the invalid state in the first and second modes.

15. The semiconductor integrated circuit apparatus according to claim 14, wherein the first power signal is varied with an EDGE-mode transmission power signal in the first mode, is varied with a GSM-mode transmission power signal in the second mode, and is varied with a W-CDMA-mode or LTE-mode transmission power signal in the third mode.

16. A cellular phone comprising semiconductor integrated circuit apparatus according to claim 9.

17. A radio-frequency power amplifier module comprising:
- a wiring substrate including a semiconductor chip, a first coupler, and a second coupler mounted thereon; wherein
- first and second power amplifier circuits, first and second power detection circuits, and an automatic power control circuit are located on the semiconductor chip;
- the first coupler detects output power from the first power amplifier circuit to output a first detected power signal;
- the second coupler detects output power from the second power amplifier circuit to output a second detected power signal;
- the first power amplifier circuit receives a first power signal within a first frequency band to perform power amplification;
- the second power amplifier circuit receives a second power signal within a second frequency band lower than the first frequency band to perform the power amplification;
- the first and second power detection circuits each include:
  - N-number first amplifier circuits that receive a detected power signal, that are cascade-connected in order from a first stage circuit to an N-th stage circuit, and that have a first gain;
  - N-number first level detection circuits that are provided for the N-number first amplifier circuits and that output currents in accordance with output levels of the first stage circuit to the N-th stage circuit of the N-number first amplifier circuits;
- a first adder circuit that adds the output currents from the N-number first level detection circuits to each other to output a first current resulting from addition performed by the first adder circuit;
- a second level detection circuit that receives the first power signal to output a second current in accordance with a level of the detected power signal;
- a synthesizer circuit that generates a third current resulting from multiplication of the first current by a first value and a fourth current resulting from multiplication of the first current by a second value lower than the first value and generates a fifth current resulting from multiplication of the second current by a third value and a sixth current resulting from multiplication of the second current by a fourth value lower than the third value to output a result of addition of the third current and the six current in a first mode and to output a result of addition of the fourth current and the fifth current in a second mode; and a current-voltage conversion circuit that converts the output current from the synthesizer circuit into voltage to output a detected voltage signal resulting from the conversion; wherein the detected power signal input into the first power detection circuit is the first detected power signal from the first coupler;

the detected power signal input into the second power detection circuit is the second detected power signal from the second coupler;

the detected voltage signal from the first power detection circuit or the second power detection circuit when the first power detection circuit or the second power detection circuit operates in the first mode is externally output from the semiconductor chip;

the detected voltage signal from the first power detection circuit or the second power detection circuit when the first power detection circuit or the second power detection circuit operates in the second mode is supplied to the automatic power control circuit; and the automatic power control circuit controls the gain of the first power amplifier circuit or the second power amplifier circuit in accordance with a result of comparison between a voltage level of the detected voltage signal and a voltage level of a power instruction signal input from outside of the semiconductor chip.

18. The radio-frequency power amplifier module according to claim 17, wherein the N-number first level detection circuits include N-number first transistors including gates that receive output voltages from the first stage circuit to the N-th stage circuit of the N-number first amplifier circuits and sources of which are grounded;

the second power detection circuit includes a second transistor including a gate of which receives the first power signal and a source of which is grounded;

the first adder circuit adds source-drain currents of the N-number first transistors to each other to output the first current; and the synthesizer circuit includes a plurality of current mirror circuits that receive the first current and source-drain current of the second transistor to generate the third, fourth, fifth and sixth currents depending on a transistor size ratio.

19. The radio-frequency power amplifier module according to claim 18, wherein the third value is higher than the second value.

20. The radio-frequency power amplifier module according to claim 19, wherein the first mode is an EDGE mode and the second mode is a GSM mode.

* * * * *